US011815820B2

(12) United States Patent
Moon

(10) Patent No.: US 11,815,820 B2
(45) Date of Patent: Nov. 14, 2023

(54) TRAINING METHOD FOR MACHINE LEARNING ASSISTED OPTICAL PROXIMITY ERROR CORRECTION

(71) Applicant: ASML NETHERLANDS B.V., Veldhoven (NL)

(72) Inventor: Jaiin Moon, San Jose, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/439,453

(22) PCT Filed: Mar. 5, 2020

(86) PCT No.: PCT/EP2020/055783
§ 371 (c)(1),
(2) Date: Sep. 15, 2021

(87) PCT Pub. No.: WO2020/187578
PCT Pub. Date: Sep. 24, 2020

(65) Prior Publication Data
US 2022/0155695 A1 May 19, 2022

Related U.S. Application Data

(60) Provisional application No. 62/821,789, filed on Mar. 21, 2019.

(51) Int. Cl.
*G03F 7/20* (2006.01)
*G03F 7/00* (2006.01)
*G06N 20/00* (2019.01)
*G06F 18/214* (2023.01)

(52) U.S. Cl.
CPC .......... *G03F 7/70633* (2013.01); *G03F 7/705* (2013.01); *G03F 7/70508* (2013.01);
(Continued)

(58) Field of Classification Search
CPC .. G03F 7/70633; G03F 7/705; G03F 7/70508; G03F 7/70533; G03F 7/70441;
(Continued)

(56) References Cited

U.S. PATENT DOCUMENTS 9,111,062 B2 8/2015 Chen et al.
2007/0031745 A1 2/2007 Ye et al.
(Continued)

FOREIGN PATENT DOCUMENTS

CN 107908071 4/2018
TW 201901285 1/2019
WO 2019048506 3/2019

OTHER PUBLICATIONS

International Search Report and Written Opinion issued in corresponding PCT Patent Application No. PCT/EP2020/055783, dated Jun. 26, 2020.
(Continued)

*Primary Examiner* — Mesfin T Asfaw
(74) *Attorney, Agent, or Firm* — Pillsbury Winthrop Shaw Pittman LLP

(57) ABSTRACT

A method of determining representative patterns for training a machine learning model to predict optical proximity corrections. The method includes obtaining a design layout including a set of groups of patterns, each group of patterns includes one or more sub-groups; determining a set of representative patterns of the set of groups of patterns, a representative pattern being a sub-group whose instances appear in the set of groups of patterns; obtaining, via simulating an optical proximity correction process using the set of representative patterns, optical proximity correction data associated with the set of representative patterns; and training a machine learning model to predict optical proximity corrections for the design layout based on the set of representative patterns and the set of optical proximity correction data.

20 Claims, 17 Drawing Sheets

(52) U.S. Cl.
CPC ........ *G03F 7/70533* (2013.01); *G06F 18/214* (2023.01); *G06N 20/00* (2019.01)

(58) Field of Classification Search
CPC ........ G03F 1/36; G06K 9/6256; G06N 20/00; G06N 5/003; G06N 7/005; G06N 20/10; G06N 20/20; G06N 3/0454; G06N 3/08
See application file for complete search history.

(56) References Cited

U.S. PATENT DOCUMENTS

| | | |
|---|---|---|
| 2007/0050749 A1 | 3/2007 | Ye et al. |
| 2008/0301620 A1 | 12/2008 | Ye et al. |
| 2008/0309897 A1 | 12/2008 | Wong et al. |
| 2010/0162197 A1 | 6/2010 | Ye et al. |
| 2010/0180251 A1 | 7/2010 | Ye et al. |
| 2018/0046072 A1 | 2/2018 | Lutich |
| 2019/0101834 A1* | 4/2019 | Cao ................. G05B 13/042 |
| 2020/0050099 A1 | 2/2020 | Su et al. |

OTHER PUBLICATIONS

Taiwanese Office Action issued in corresponding Taiwanese Patent Application No. 109108370, dated Dec. 22, 2020.

Spence, C.: "Full-Chip Lithography Simulation and Design Analysis—How OPC is Chanooin IC Desion", Proc. of SPIE, vol. 5751, pp. 1-14 (2005).

Shen, Y. et al.: "Level-Set-Based Inverse Lithography for Photomask Synthesis", Optics Express, vol. 17, pp. 23690-23701 (2009).

Krizhevsky, A. et al.: "ImageNet Classification with Deep Convolutional Neural Networks", Communications of the ACM, vol. 60, Issue 6, pp. 84-90 (Jun. 2017).

Szegedy, C. et al.: "Going Deeper with Convolutions", 2015 IEEE Conference on Computer Vision and Pattern Recognition, pp. 1-9 (2015).

Simonyan, K. et al.: "Very Deep Convolutional Networks for Large-Scale Image Recognition", International Conference on Learning Representations, arxiv.org/abs/1409.1556 (2015).

He, K. et al.: "Deep Residual Learning for Image Recognition", 2016 IEEE Conference on Computer Vision and Pattern Recognition. pp. 770-778 (2016).

Yu, Bo-Yi, et al.: "Deep learning-based framework for comprehensive mask optimization", Proceedings of the 24th Asia and South Pacific Design Automation Conference, Association for Computing Machinery, pp. 311-316 (Jan. 21, 2019).

Chen, Kun-Yuan et al.: "Full-Chip application of machine learning SRAFs on DRAM case using auto pattern selection", Proc. of SPIE, vol. 10961 (2019).

* cited by examiner

TRAINING METHOD FOR MACHINE LEARNING ASSISTED OPTICAL PROXIMITY ERROR CORRECTION

CROSS-REFERENCE TO RELATED APPLICATIONS

This application is the U.S. national phase entry of PCT patent application no. PCT/EP2020/055783, which was filed on Mar. 5, 2020, which claims the benefit of priority of U.S. patent application No. 62/821,789, which was filed on Mar. 21, 2019, and which is incorporated herein in its entirety by reference.

TECHNICAL FIELD

The description herein relates to lithographic apparatuses and processes, and more particularly to a tool and a method to make optical proximity error corrections of a design layout.

BACKGROUND

A lithographic apparatus can be used, for example, in the manufacture of integrated circuits (ICs) or other devices. In such a case, a patterning device (e.g., a mask) may contain or provide a pattern corresponding to an individual layer of the device ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic apparatus, one target portion at a time. In one type of lithographic apparatus, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic apparatus will have a magnification factor M (generally <1), the speed F at which the substrate is moved will be a factor M times that at which the projection beam scans the patterning device.

Prior to the device fabrication procedure of transferring the pattern from the patterning device to the substrate of the device manufacturing process, the substrate may undergo various device fabrication procedures of the device manufacturing process, such as priming, resist coating and a soft bake. After exposure, the substrate may be subjected to other device fabrication procedures of the device manufacturing process, such as a post-exposure bake (PEB), development, and a hard bake. This array of device fabrication procedures is used as a basis to make an individual layer of a device, e.g., an IC. The substrate may then undergo various device fabrication procedures of the device manufacturing process such as etching, ion-implantation (doping), metallization, oxidation, chemo-mechanical polishing, etc., all intended to finish off the individual layer of the device. If several layers are required in the device, then the whole process, or a variant thereof, is repeated for each layer. Eventually, a device will be present in each target portion on the substrate. If there is a plurality of devices, these devices are then separated from one another by a technique such as dicing or sawing, whence the individual devices can be mounted on a carrier, connected to pins, etc.

So, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical or nanoimprint lithography using a lithographic apparatus, to provide a pattern on a substrate and typically, but optionally, involves one or more related pattern processing steps, such as resist development by a development apparatus, baking of the substrate using a bake tool, etching using the pattern using an etch apparatus, etc. Further, one or more metrology processes are typically involved in the patterning process.

SUMMARY

In an embodiment, there is provided a method of determining representative patterns for training a machine learning model to predict optical proximity corrections. The method includes obtaining a design layout comprising a set of group of patterns, each group of patterns includes one or more sub-groups; determining a set of representative patterns of the set of group of patterns, a representative pattern being a sub-group whose instances appear in the set of group patterns; obtaining, via simulating an optical proximity correction process using the set of representative patterns, reference optical proximity correction data associated with the set of representative patterns; and training a machine learning model to predict optical proximity corrections for the design layout based on the set of representative patterns and the set of reference optical proximity correction data.

Furthermore, in an embodiment, there is provided, a lithographic apparatus for a patterning process. The apparatus includes a mask associated with a design layout; a substrate to be imaged using the mask; and a processor configured to: obtain (i) a set of representative patterns of the design layout to be printed on the substrate, and (ii) process conditions associated with the set of representative patterns; and control, via the lithographic apparatus, parameters of the patterning process according to the process conditions.

Furthermore, in an embodiment, there is provided, a computer program product comprising a non-transitory computer readable medium having instructions recorded thereon, the instructions when executed by a computer implementing the method of any of the above claims.

The foregoing general description of the illustrative implementations and the following detailed description thereof are merely exemplary aspects of the teachings of this disclosure, and are not restrictive.

BRIEF DESCRIPTION OF FIGURES

The accompanying drawings, which are incorporated in and constitute a part of the specification, illustrate one or more embodiments and, together with the description, explain these embodiments. The accompanying drawings have not necessarily been drawn to scale. Any values dimensions illustrated in the accompanying graphs and figures are for illustration purposes only and may or may not represent actual or preferred values or dimensions. Where applicable, some or all features may not be illustrated to assist in the description of underlying features. In the drawings.

Figure 1:
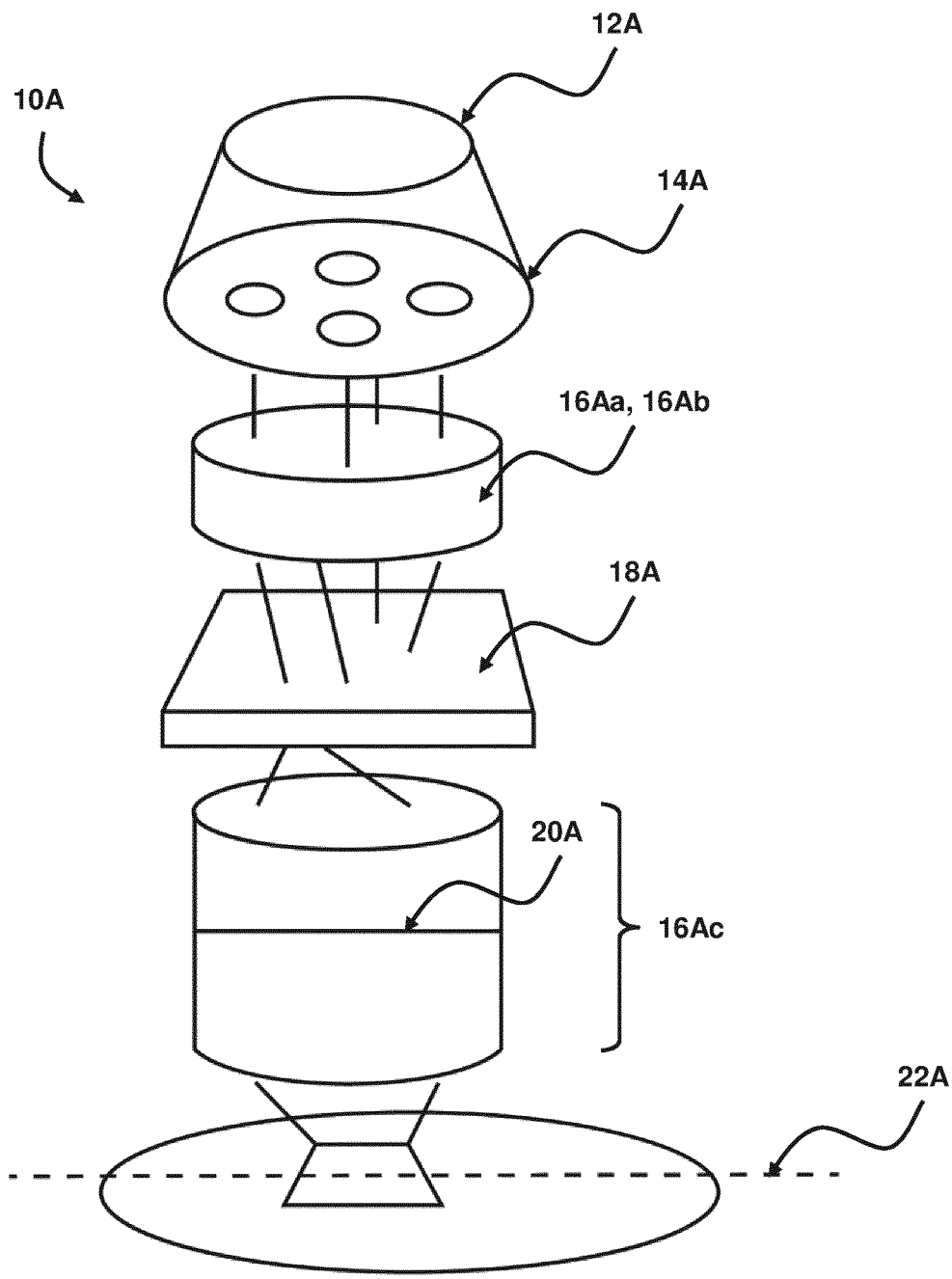
FIG. 1 is a block diagram of various subsystems of a lithography system according to an exemplary embodiment of the present disclosure.

Embodiments will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Wherever convenient, the same reference numbers will be used throughout the drawings to refer to same or like parts. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

DETAILED DESCRIPTION

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed embodiment(s). However, it will be apparent to those skilled in the art that the disclosed embodiment(s) may be practiced without those specific details. In some instances, well-known structures and components may be shown in block diagram form in order to avoid obscuring the concepts of the disclosed subject matter.

As semiconductor or other device manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic apparatuses that project a design layout onto a substrate using illumination from a deep-ultraviolet (e.g., 193 nm) illumination source or an extreme-ultraviolet (e.g., 13.52 nm) illumination source, creating individual functional elements having dimensions well below 30 nm.

This process in which features with dimensions smaller than the classical resolution limit of a lithographic apparatus are printed, is commonly known as low-k1 lithography, according to the resolution formula $CD=k_1\times\lambda/NA$, where $\lambda$ is the wavelength of radiation employed (currently in most cases 248 nm or 193 nm), NA is the numerical aperture of projection optics in the lithographic apparatus, CD is the "critical dimension"—generally the smallest feature size printed—and k1 is an empirical resolution factor. In general, the smaller k1 the more difficult it becomes to reproduce a pattern on the substrate that resembles the shape and dimensions planned by a circuit designer in order to achieve particular electrical functionality and performance. To overcome these difficulties, sophisticated fine-tuning steps are applied to the lithographic apparatus or the design layout. These include, for example, but not limited to, optimization of NA and optical coherence settings, customized illumination schemes, use of phase shifting patterning devices, optical proximity correction (OPC) in the design layout, or other methods generally defined as "resolution enhancement techniques" (RET).

As an example of RET, OPC addresses the fact that the final size and placement of an image of the design layout projected on the substrate will not be identical to, or simply depend only on the size and placement of the design layout on the patterning device. It is noted that the terms "mask", "reticle", "patterning device" are utilized interchangeably herein. Also, person skilled in the art will recognize that, the term "mask," "patterning device" and "design layout" can be used interchangeably, as in the context of RET, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another or non-geometrical optical effects such as diffraction and interference. Similarly, proximity effects may arise from diffusion and other chemical effects during post-exposure bake (PEB), resist development, and etching that generally follow lithography.

In order to increase the chance that the projected image of the design layout is in accordance with requirements of a given target circuit design, proximity effects may be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

One of the simplest forms of OPC is selective bias. Given a CD vs. pitch curve, all of the different pitches could be forced to produce the same CD, at least at best focus and exposure, by changing the CD at the patterning device level. Thus, if a feature prints too small at the substrate level, the patterning device level feature would be biased to be slightly larger than nominal, and vice versa. Since the pattern transfer process from patterning device level to substrate level is non-linear, the amount of bias is not simply the measured CD error at best focus and exposure times the reduction ratio, but with modeling and experimentation an appropriate bias can be determined. Selective bias is an incomplete solution to the problem of proximity effects, particularly if it is only applied at the nominal process condition. Even though such bias could, in principle, be applied to give uniform CD vs. pitch curves at best focus and exposure, once the exposure process varies from the nominal condition, each biased pitch curve will respond differently, resulting in different process windows for the different features. A process window being a range of values of two or more process parameters (e.g., focus and radiation dose in the lithographic apparatus) under which a feature is sufficiently properly created (e.g., the CD of the feature is within a certain range such as ±10% or ±5%). Therefore, the "best" bias to give identical CD vs. pitch may even have a negative impact on the overall process window, reducing rather than enlarging the focus and exposure range within which all of the target features print on the substrate within the desired process tolerance.

Other more complex OPC techniques have been developed for application beyond the one-dimensional bias example above. A two-dimensional proximity effect is line end shortening. Line ends have a tendency to "pull back" from their desired end point location as a function of exposure and focus. In many cases, the degree of end shortening of a long line end can be several times larger than the corresponding line narrowing. This type of line end pull back can result in catastrophic failure of the devices being manufactured if the line end fails to completely cross over the underlying layer it was intended to cover, such as a polysilicon gate layer over a source-drain region. Since this type of pattern is highly sensitive to focus and exposure, simply biasing the line end to be longer than the design length is inadequate because the line at best focus and exposure, or in an underexposed condition, would be excessively long, resulting either in short circuits as the extended line end touches neighboring structures, or unnecessarily large circuit sizes if more space is added between individual features in the circuit. Since one of the goals of integrated circuit design and manufacturing is to maximize the number of functional elements while minimizing the area required per chip, adding excess spacing is an undesirable solution.

Two-dimensional OPC approaches may help solve the line end pull back problem. Extra structures (also known as "assist features") such as "hammerheads" or "serifs" may be added to line ends to effectively anchor them in place and provide reduced pull back over the entire process window. Even at best focus and exposure these extra structures are not resolved but they alter the appearance of the main feature without being fully resolved on their own. A "main feature" as used herein means a feature intended to print on a substrate under some or all conditions in the process window. Assist features can take on much more aggressive forms than simple hammerheads added to line ends, to the extent the pattern on the patterning device is no longer simply the desired substrate pattern upsized by the reduction ratio. Assist features such as serifs can be applied for many more situations than simply reducing line end pull back. Inner or outer serifs can be applied to any edge, especially two dimensional edges, to reduce corner rounding or edge extrusions. With enough selective biasing and assist features of all sizes and polarities, the features on the patterning device bear less and less of a resemblance to the final pattern desired at the substrate level. In general, the patterning device pattern becomes a pre-distorted version of the substrate-level pattern, where the distortion is intended to counteract or reverse the pattern deformation that will occur during the manufacturing process to produce a pattern on the substrate that is as close to the one intended by the designer as possible.

Another OPC technique involves using completely independent and non-resolvable assist features, instead of or in addition to those assist features (e.g., serifs) connected to the main features. The term "independent" here means that edges of these assist features are not connected to edges of the main features. These independent assist features are not intended or desired to print as features on the substrate, but rather are intended to modify the aerial image of a nearby main feature to enhance the printability and process tolerance of that main feature. These assist features (often referred to as "scattering bars" or "SBAR") can include sub-resolution assist features (SRAF) which are features outside edges of the main features and sub-resolution inverse features (SRIF) which are features scooped out from inside the edges of the main features. The presence of a SBAR adds yet another layer of complexity to a patterning device pattern. A simple example of a use of scattering bars is where a regular array of non-resolvable scattering bars is drawn on both sides of an isolated line feature, which has the effect of making the isolated line appear, from an aerial image standpoint, to be more representative of a single line within an array of dense lines, resulting in a process window much closer in focus and exposure tolerance to that of a dense pattern. The common process window between such a decorated isolated feature and a dense pattern will have a larger common tolerance to focus and exposure variations than that of a feature drawn as isolated at the patterning device level.

An assist feature may be viewed as a difference between features on a patterning device and features in the design layout. The terms "main feature" and "assist feature" do not imply that a particular feature on a patterning device must be labeled as one or the other.

As a brief introduction, FIG. 1 illustrates an exemplary lithographic projection apparatus 10A. Major components include illumination optics which define the partial coherence (denoted as sigma) and which may include optics 14A, 16Aa and 16Ab that shape radiation from a radiation source 12A, which may be a deep-ultraviolet excimer laser source or other type of source including an extreme ultra violet (EUV) source (as discussed herein, the lithographic projection apparatus itself need not have the radiation source); and optics 16Ac that project an image of a patterning device pattern of a patterning device 18A onto a substrate plane 22A. An adjustable filter or aperture 20A at the pupil plane of the projection optics may restrict the range of beam angles that impinge on the substrate plane 22A, where the largest possible angle defines the numerical aperture of the projection optics $NA=\sin(\Theta_{max})$.

Figure 2:
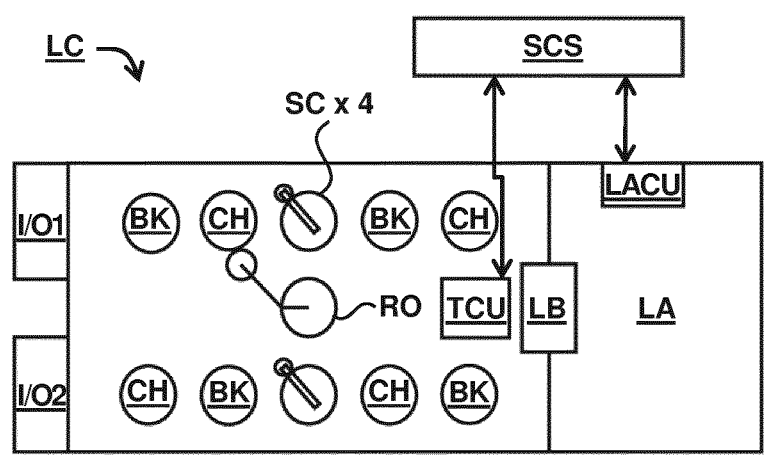
FIG. 2 schematically depicts an embodiment of a lithographic cell or cluster according to an exemplary embodiment of the present disclosure.

In a lithographic projection apparatus, projection optics direct and shape the illumination from a source via a patterning device and onto a substrate. The term "projection optics" is broadly defined here to include any optical component that may alter the wavefront of the radiation beam. For example, projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image. The resist model is related only to properties of the resist layer (e.g., effects of chemical processes which occur during exposure, post-exposure bake (PEB) and development). Optical properties of the lithographic projection apparatus (e.g., properties of the illumination, the patterning device and the projection optics) dictate the aerial image and can be defined in an optical model. Since the patterning device used in the lithographic projection apparatus can be changed, it is desirable to separate the optical properties of the patterning device from the optical properties of the rest of the lithographic projection apparatus including at least the source and the projection optics. Details of techniques and models used to transform a design layout into various lithographic images (e.g., an aerial image, a resist image, etc.), apply OPC using those techniques and models and evaluate performance (e.g., in terms of process window) are described in U.S. Patent Application Publication Nos. US 2008-0301620, 2007-0050749, 2007-0031745, 2008-0309897, 2010-0162197, and 2010-0180251, the disclosure of each which is hereby incorporated by reference in its entirety As shown in FIG. 2, the lithographic apparatus LA may form part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput (e.g., substrates processed per unit time) and processing efficiency. The lithographic cell LC may further comprises one or more etchers to etch the substrate and one or more measuring devices configured to measure a parameter of the substrate. The measuring device may comprise an optical measurement device configured to measure a physical parameter of the substrate, such as a scatterometer, a scanning electron microscope, etc. The measuring device may be incorporated in the lithographic apparatus LA. An embodiment of the present disclosure may be implemented in or with the supervisory control system SCS or the lithographic control unit LACU. For example, data from the supervisory control system SCS or the lithographic control unit LACU may be used by an embodiment of the present disclosure and one or more signals from an embodiment of the present disclosure may be provided to the supervisory control system SCS or the lithographic control unit LACU.

Figure 3:
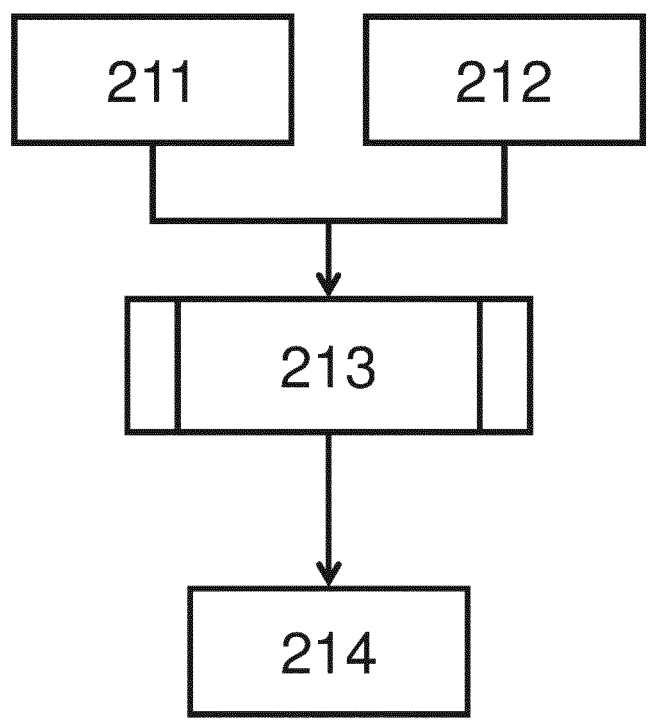
FIG. 3 schematically depicts a method of placing assist features (assist features connected to main features or independent assist features) into a design layout according to an exemplary embodiment of the present disclosure.

FIG. 3 schematically depicts a method of making optical proximity corrections 214 in a design layout. The design layout may be a design layout before application of a RET or a design layout after application of a RET. The design layout may be binary or continuous tone. In this disclosure, focus is made on placing assist features (assist features connected to main features or independent assist features) into a design layout as an example optical proximity correction to which the techniques herein can be applied. As will be appreciated, the techniques herein can be applied to alternative optical proximity corrections than assist features (such as bias, etc.) or applied to optical proximity corrections in addition to assist features (e.g., a combination of bias and assist features).

A computational or an empirical model 213 can be used to apply (e.g., determining one or more characteristics, such as the existence, location, type, shape, etc., of) one or more optical proximity corrections such as one or more assist features. The model 213 can take into account one or more characteristics 211 (also referred to as a processing parameter) of the device manufacturing process, or one or more design layout parameters 212, or both. The one or more processing parameters 211 are one or more parameters associated with the device manufacturing process but not with the design layout. For example, the one or more processing parameters 211 may include a characteristic of the illumination (e.g., intensity, pupil profile, etc.), a characteristic of the projection optics, dose, focus, a characteristic of the resist, a characteristic of development of the resist, a characteristic of post-exposure baking of the resist, or a characteristic of etching. The one or more design layout parameters 212 may include one or more shapes, sizes, relative locations, or absolute locations of various features on a design layout, and also overlapping of features on different design layouts. In an empirical model, the image (e.g., resist image, optical image, etch image) is not simulated; instead, the empirical model makes an optical correction (e.g., places an assist feature) based on a correlation between the input (e.g., the one or more processing parameters 211 or the design layout parameters 212) and the optical proximity correction. In a computational model, a portion or a characteristic of the image is calculated, and the optical proximity correction is applied based on the portion or the characteristic of the calculated image.

An example of an empirical model is a machine learning model. Both unsupervised machine learning and supervised machine learning models may be used to make an optical proximity correction (e.g., placement of assist features). Without limiting the scope of the present disclosure, applications of supervised machine learning algorithms are described below.

Supervised learning is the machine learning task of inferring a function from labeled training data. The training data includes a set of training examples. In supervised learning, each example is a pair having an input object (typically a vector) and a desired output value (also called the supervisory signal). A supervised learning algorithm analyzes the training data and produces an inferred function, which can be used for mapping new examples. In an embodiment, an optimal scenario will allow the algorithm to correctly determine the class labels for unseen instances. This requires the learning algorithm to generalize from the training data to unseen situations in a "reasonable" way.

Given a set of N training examples of the form $\{(x_1, y_1), (x_2, y_2), \ldots, (x_N, y_N)\}$ such that $x_i$ is the feature vector of the i-th example and $y_i$ is its label (i.e., class), a learning algorithm seeks a function g: X→Y, where X is the input space and Y is the output space. A feature vector is an n-dimensional vector of numerical features that represent some object. Many algorithms in machine learning require a numerical representation of objects, since such representations facilitate processing and statistical analysis. When representing images, the feature values might correspond to the pixels of an image, when representing texts perhaps term occurrence frequencies. The vector space associated with these vectors is often called the feature space. The function g is an element of some space of possible functions G, usually called the hypothesis space. It is sometimes convenient to represent g using a scoring function f: X×Y→$\mathbb{R}$ such that g is defined as returning the y value that gives the highest score:

$$g(x) = \arg\max_y f(x, y),$$

wherein F denotes the space of scoring functions.

Although G and F can be any space of functions, many learning algorithms are probabilistic models where g takes the form of a conditional probability model g(x)=P(y|x), or f takes the form of a joint probability model f(x, y)=P(x, y). For example, naive Bayes and linear discriminant analysis are joint probability models, whereas logistic regression is a conditional probability model.

There are two basic approaches to choosing for g: empirical risk minimization and structural risk minimization. Empirical risk minimization seeks the function that best fits the training data. Structural risk minimization includes a penalty function that controls the bias/variance tradeoff.

In both cases, it is assumed that the training set has a sample of independent and identically distributed pairs $(x_i, y_i)$. In order to measure how well a function fits the training data, an objective function is typically defined. For, a cost or loss function L: Y×Y→$\mathbb{R}^{\geq 0}$ can be defined. In this situation, for training example $(x_i, y_i)$, the loss of predicting the value $\hat{y}$ is $L(y_i, \vec{y})$. The risk R(g) of function g is defined as the expected loss of g. This can be estimated from the training data as $$R_{emp}(g) = \frac{1}{N}\Sigma_i\ L(y_i, g(x_i)).$$

Exemplary models of supervised learning include decision trees, ensembles (bagging, boosting, random forest), k-NN, linear regression, naive Bayes, neural networks, logistic regression, perceptron, support vector machine (SVM), relevance vector machine (RVM), and deep learning.

SVM is an example of supervised learning model, which analyzes data and recognizes patterns and can be used for classification and regression analysis. Given a set of training examples, each marked as belonging to one of two categories, a SVM training algorithm builds a model that assigns new examples into one category or the other, making it a non-probabilistic binary linear classifier. A SVM model is a representation of the examples as points in space, mapped so that the examples of the separate categories are divided by a clear gap that is as wide as possible. New examples are then mapped into that same space and predicted to belong to a category based on which side of the gap they fall on. In addition to performing linear classification, SVMs can efficiently perform a non-linear classification using what is called the kernel methods, implicitly mapping their inputs into high-dimensional feature spaces.

Kernel methods involve a user-specified kernel, i.e., a similarity function over pairs of data points in raw representation. Kernel methods owe their name to the use of kernel functions, which enable them to operate in a high-dimensional, implicit feature space without ever computing the coordinates of the data in that space, but rather by simply computing the inner products between the images of all pairs of data in the feature space. This operation is often computationally cheaper than the explicit computation of the coordinates. This approach is called the "kernel trick."

The effectiveness of SVM depends on the selection of kernel, the kernel's parameters, and soft margin parameter C. A common choice is a Gaussian kernel, which has a single parameter γ. The best combination of C and γ is often selected by a grid search (also known as "parameter sweep") with exponentially growing sequences of C and γ, for example, C∈$\{2^{-5}, 2^{-4}, \ldots, 2^{15}, 2^{16}\}$; γ∈$\{2^{-15}, 2^{-14}, \ldots, 2^4, 2^5\}$.

A grid search is an exhaustive searching through a manually specified subset of the hyperparameter space of a learning algorithm. A grid search algorithm is guided by some performance metric, typically measured by cross-validation on the training set or evaluation on a held-out validation set.

Each combination of parameter choices may be checked using cross validation, and the parameters with best cross-validation accuracy are picked.

Cross-validation, sometimes called rotation estimation, is a model validation technique for assessing how the results of a statistical analysis will generalize to an independent data set. It is mainly used in settings where the goal is prediction, and one wants to estimate how accurately a predictive model will perform in practice. In a prediction problem, a model is usually given a dataset of known data on which training is run (training dataset), and a dataset of unknown data (or first seen data) against which the model is tested (testing dataset). The goal of cross validation is to define a dataset to "test" the model in the training phase (i.e., the validation dataset), in order to limit problems like overfitting, give an insight on how the model will generalize to an independent data set (i.e., an unknown dataset, for instance from a real problem), etc. One round of cross-validation involves partitioning a sample of data into complementary subsets, performing the analysis on one subset (called the training set), and validating the analysis on the other subset (called the validation set or testing set). To reduce variability, multiple rounds of cross-validation are performed using different partitions, and the validation results are averaged over the rounds.

The final model, which can be used for testing and for classifying new data, is then trained on the entire training set using the selected parameters.

Another example of supervised learning is regression. Regression infers the relationships between a dependent variable and one or more independent variables, from a set of values of the dependent variables and corresponding values of the independent variables. Regression may estimate the conditional expectation of the dependent variable given the independent variables. The inferred relationships may be called the regression function. The inferred relationships may be probabilistic.

Typically, a design layout has billions of patterns and a sample of such patterns much be chosen for determining patterning process parameter, training process models, etc. So, it is desirable to choose diverse patterns that are representative of the design layout. However, for choosing sample for Machine Learning SRAF on fullchip circuit design, currently there was no clear way to systematically and efficiently choose diverse sample (e.g., representative patterns) for learning. In one known approach, pattern samples are extracted from a design layout based on human instinct or knowledge about important locations or known hotspots on the design of the circuit design. In another approach, a pattern search algorithm is defined to identify unique patterns in a design layout. In such search algorithm, desired characteristics associated with a desired pattern are defined, and the search algorithm searches for patterns that satisfies such desired characteristics within the design layout. However, such search algorithms are not accurate and the characteristics may be user-defined and may not be systematically defined.

Since fullchip circuit design has a lot of diversity in patterns, relatively less of unique pattern (than actual unique patterns that exists in the design layout) may be selected for machine learning which results in under-fitted model (e.g., machine learning model). In another case, relatively high number of similar patterns may be selected for machine learning which can lead to over fitted-model. Also, since there is no clear method to systematically capture unique designs from fullchip, machined learned model results in a poor coverage to fullchip design. In an embodiment, coverage refers to a selected set of patterns (e.g., 500,000; 250,000, 100,000 or less) that cover or represent approximately the entire design layout (e.g., having billions of patterns). Accordingly, in an embodiment, a high coverage indicates relatively high to all the design patterns are covered by a selected set of patterns, while a poor coverage indicates relatively low number design patterns are covered by a selected set of patterns.

Figure 4A:
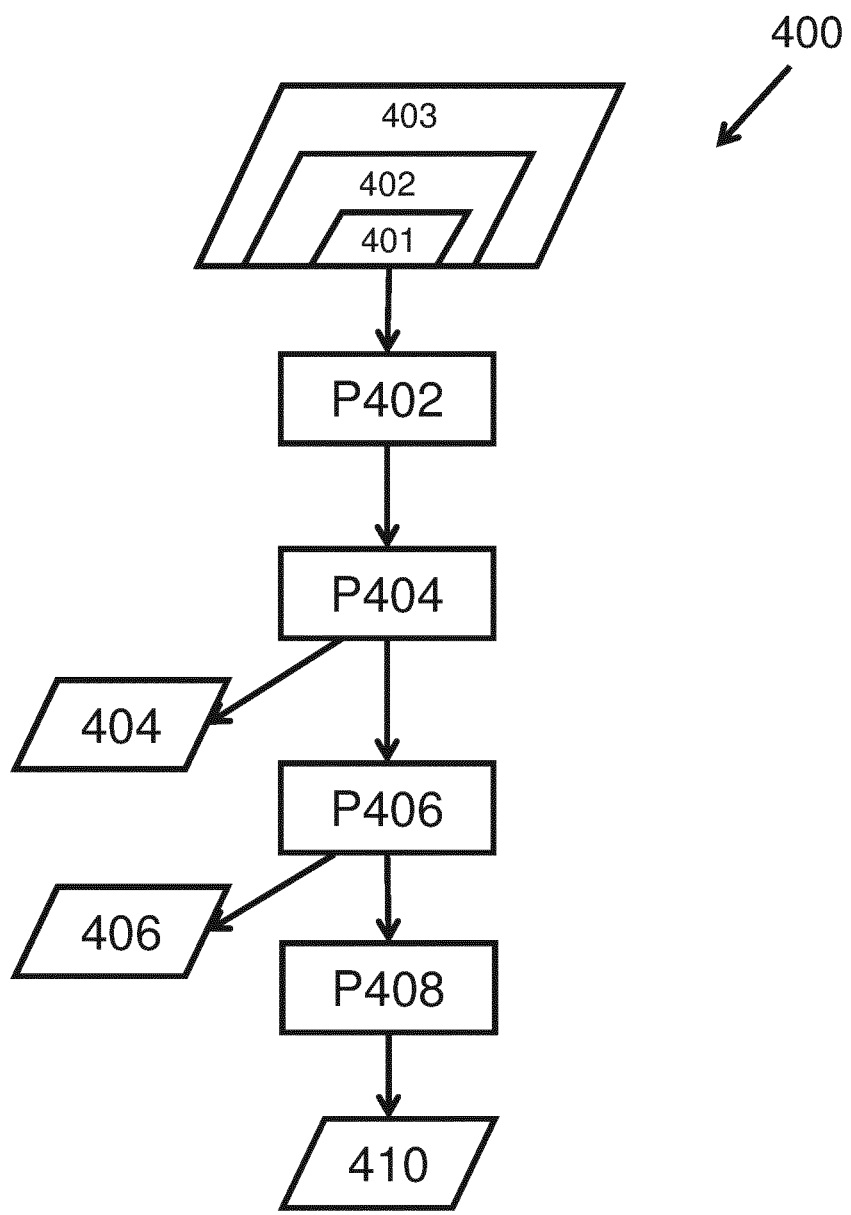
FIG. 4A is a flow chart for a method of determining representative patterns for training a machine learning model to predict optical proximity corrections according to an exemplary embodiment of the present disclosure.

FIG. 4A is a flow chart of a method 400 of determining representative patterns for training a machine learning model to predict optical proximity corrections. Such represented patterns ensure that the trained machine learning model is not over-fitted or under-fitted. In other words, using the presentative patterns for training a model (e.g., machine learning model) ensures that training data does not include relatively higher number of similar pattern thereby no over-fitting, nor does the training data omit dissimilar patterns thereby no under fitting.

The method 400, in procedure P402, involves obtaining a design layout 403 comprising a set of group of patterns 402 a set of group of patterns, each group of patterns includes one or more sub-groups 401. FIG. 4C illustrates an example of a design layout 403 comprising a set of group of patterns 402 e.g., {G1, G2, G3, G4, G5, G7, G8, G9, G10 . . . }. Further, the group of pattern includes one or more sub-groups 401 such as group G1 includes sub-groups {sg1, sg2, sg3 . . . }. In an embodiment, the set of group of patterns are spread at different locations on the design layout 403.

In an embodiment, the group of patterns are arranged in a hierarchy in which each group of patterns includes the one or more sub-groups of pattern. Accordingly, a sub-group (e.g., sg2 in FIG. 4C) appears in more than one groups (e.g., G1 and G3 in FIG. 4C). In an embodiment, the hierarchy of a group of pattern refers to a data structure used to represent the group of patterns. In an embodiment, the hierarchy includes one or more sub-group of patterns that are positioned within a data structure (e.g., ranked) one above the other according to a design criteria. For example, the sub-groups may be arranged in a hierarchy based on a number of features within a sub-group of pattern, criticality of a sub-group of pattern, or other criteria. The hierarchy comprises several sub-levels, where each sub-level includes one or more sub-group of patterns. For example, G1 may be considered a top level and sub-groups sg1, sg2, and sg3 may be part of a first sub-level of G1. Further, a sub-group (e.g., sg1) may include another sub-group (e.g., sg11, sg12, sg13, etc. (not illustrated)) that may be considered a sub-level of the first sub-level. The present disclosure is not limited to a particular hierarchical structure of the design layout.

In an embodiment, the hierarchical structure is configured such that a search within this structure may be performed to find a particular sub-group of pattern. In an embodiment, a visual marker or a boundary around the particular sub-group of pattern may be generated so that one or more locations of the particular sub-group can be marked on the design layout. In an embodiment, features within the marker may be used for training, generating OPC, or other applications. In an embodiment, such visual marker may be enable association of the particular sub-group with criticality of a location (e.g., hot spot locations are highly critical compared to other locations). In an embodiment, patterns associated with hot spots can be used for determining process window (e.g., dose, focus) of a patterning process, OPC to maximize the process window, and/or values of one or more processing parameters.

In an embodiment, the hierarchical representation provides a systematic data structure to the design layout thereby enabling a systematic search for representative patterns of the design layout 403.

Further, procedure P404 involves determining a set of representative patterns 404 of the set of group of patterns 402 (and by extension the design layout 401). A representative pattern is a sub-group whose instances appear in the set of group patterns. For example, as shown in FIG. 4C, a set of representative patterns is R comprising sub-groups sg1, sg2, sg3, and sgx. As shown, the representative pattern sg1 has a plurality of instances, particularly in the groups G1, G2, and G4. As shown the instances of sg1 are located at different locations on the design layout 403. In an embodiment, marker or boundary may be drawn around the instances of each of the instances of the pattern being search.

Figures 7A, 7B:
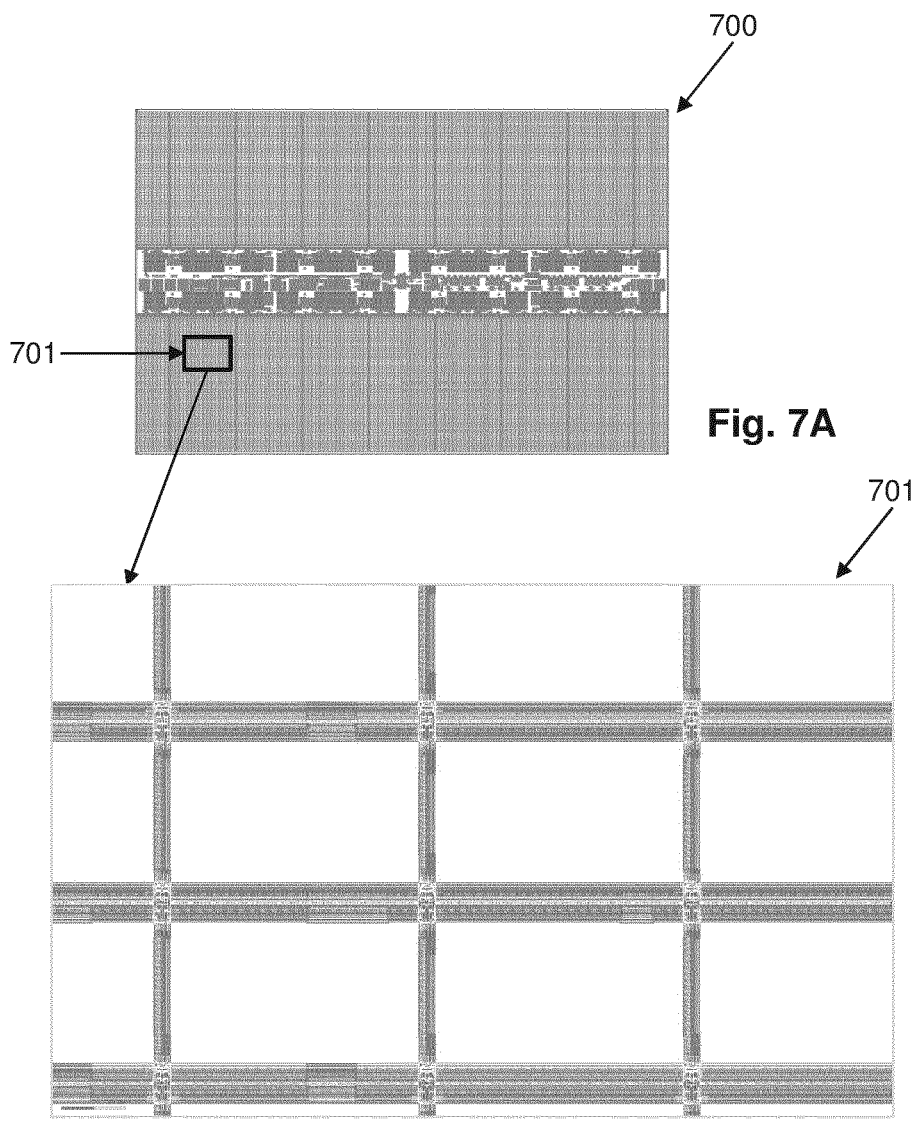
FIG. 7A is an example design layout and FIG. 7B is a group of pattern of design layout according to an exemplary embodiment of the present disclosure.
Figure 8:
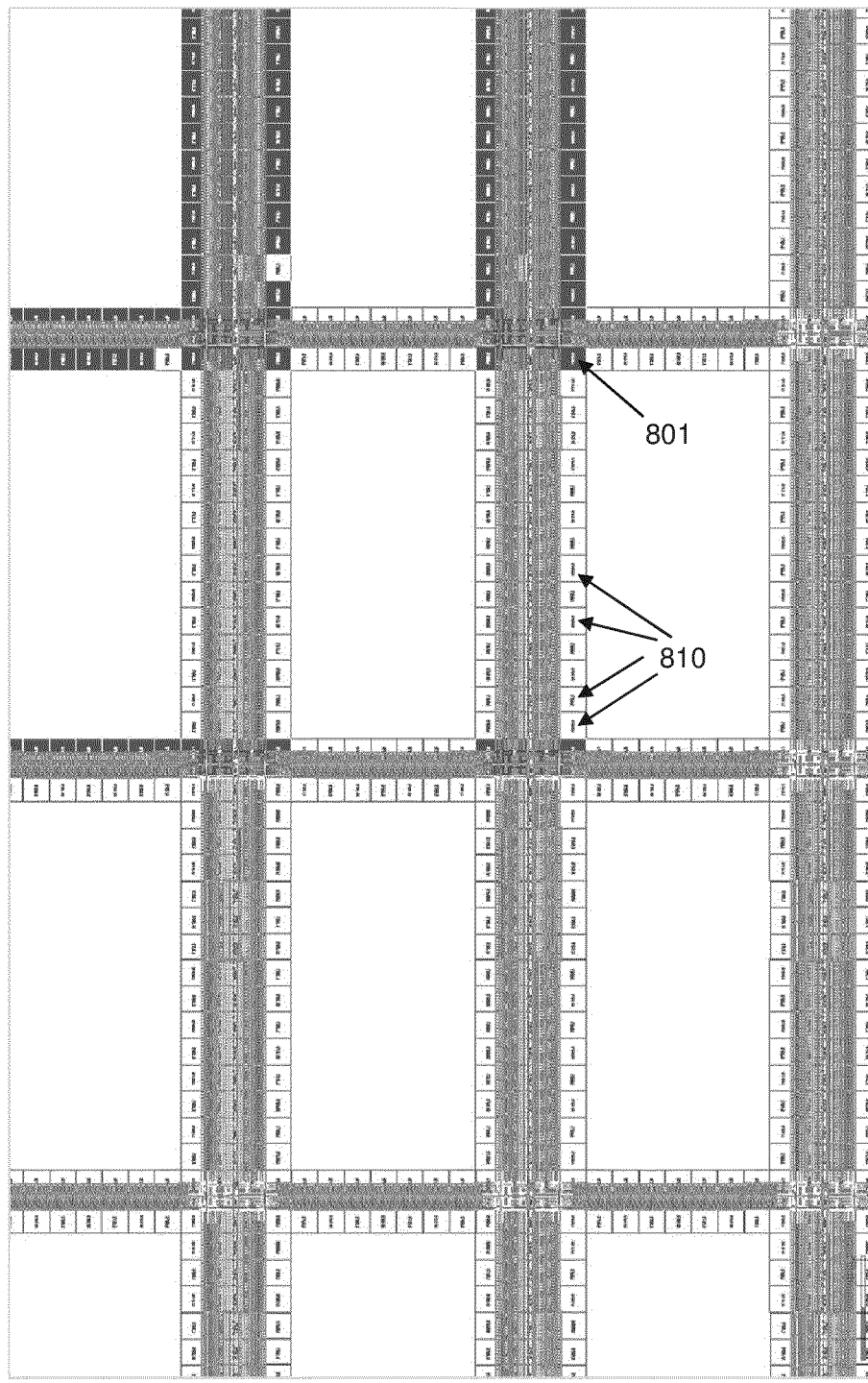
FIG. 8 illustrates instances of a representative pattern identified in the design layout of FIG. 7A according to an exemplary embodiment of the present disclosure.

An example of search is illustrated visually in FIGS. 7A-7B and 8. FIG. 7A is an example design layout 700, and a group of pattern 701 (e.g. a portion of the design layout 700) is illustrated in FIG. 7B. Within the group of pattern 700, instances 810 of a representative pattern 801 is shown in FIG. 8. In FIG. 8, the outline or marker around the representative pattern 801 may also be generated and provided to an image for highlighting the representative pattern on a display screen.

Figure 4B:
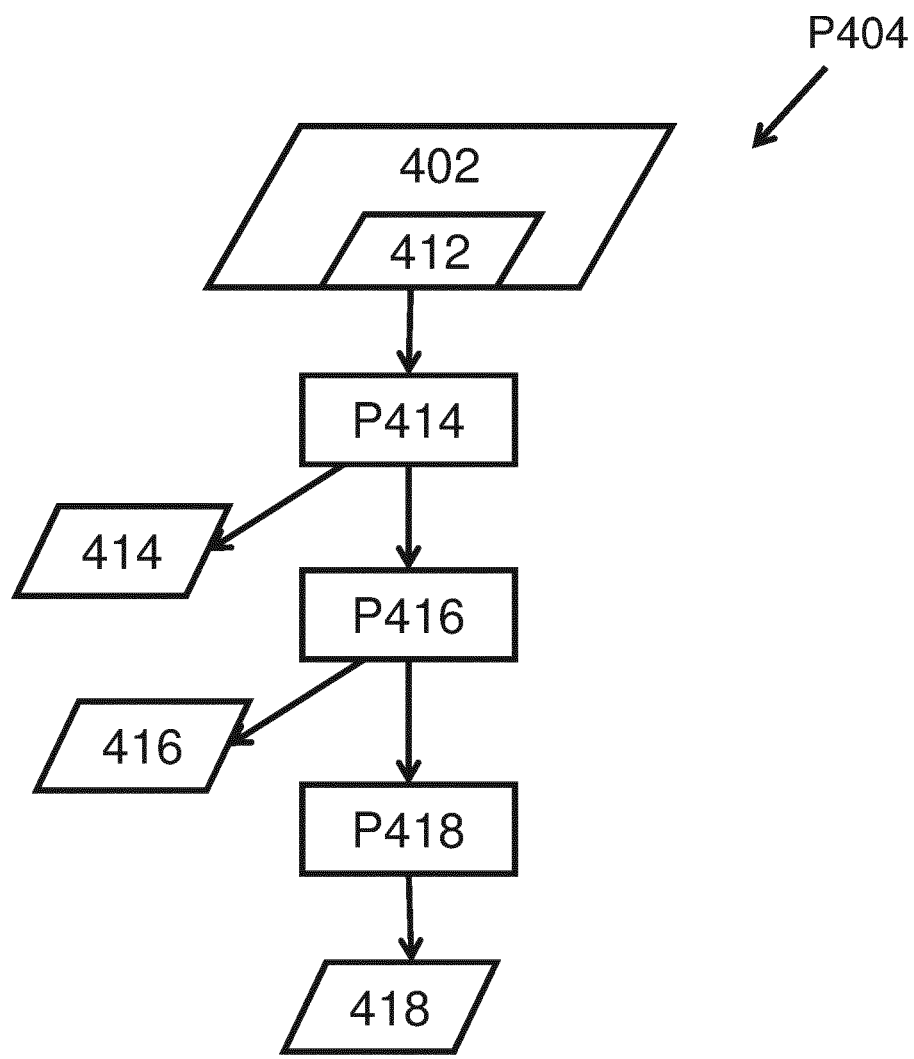
FIG. 4B is a flow chart for determining of set of representative patterns of FIG. 4A according to an exemplary embodiment of the present disclosure.
Figure 4C:
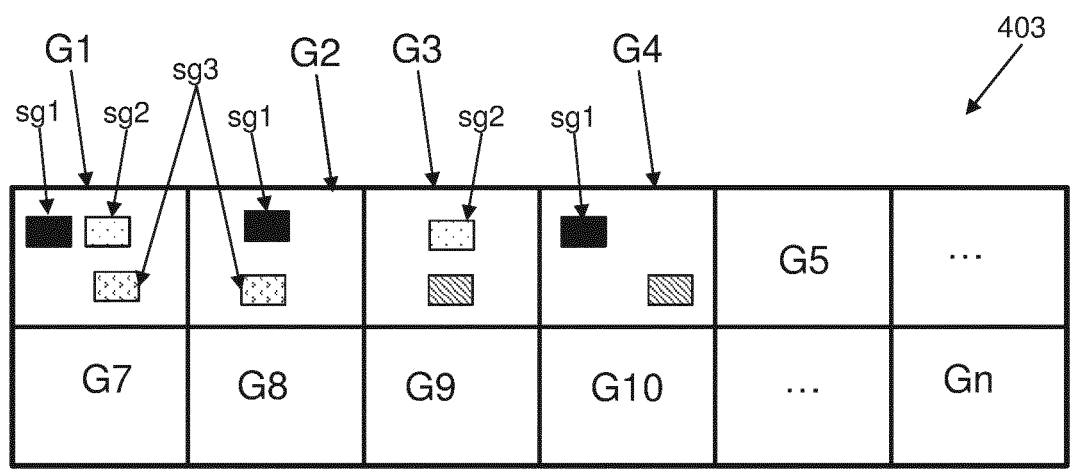
FIG. 4C of categorizing the instances of the given subgroup as the representative pattern of FIG. 4B according to an exemplary embodiment of the present disclosure.
Figure 4C:
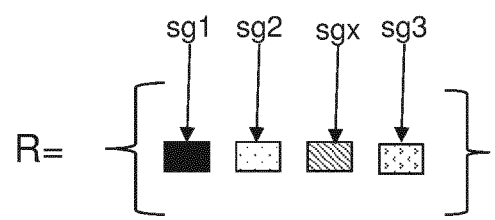
Figure 5:
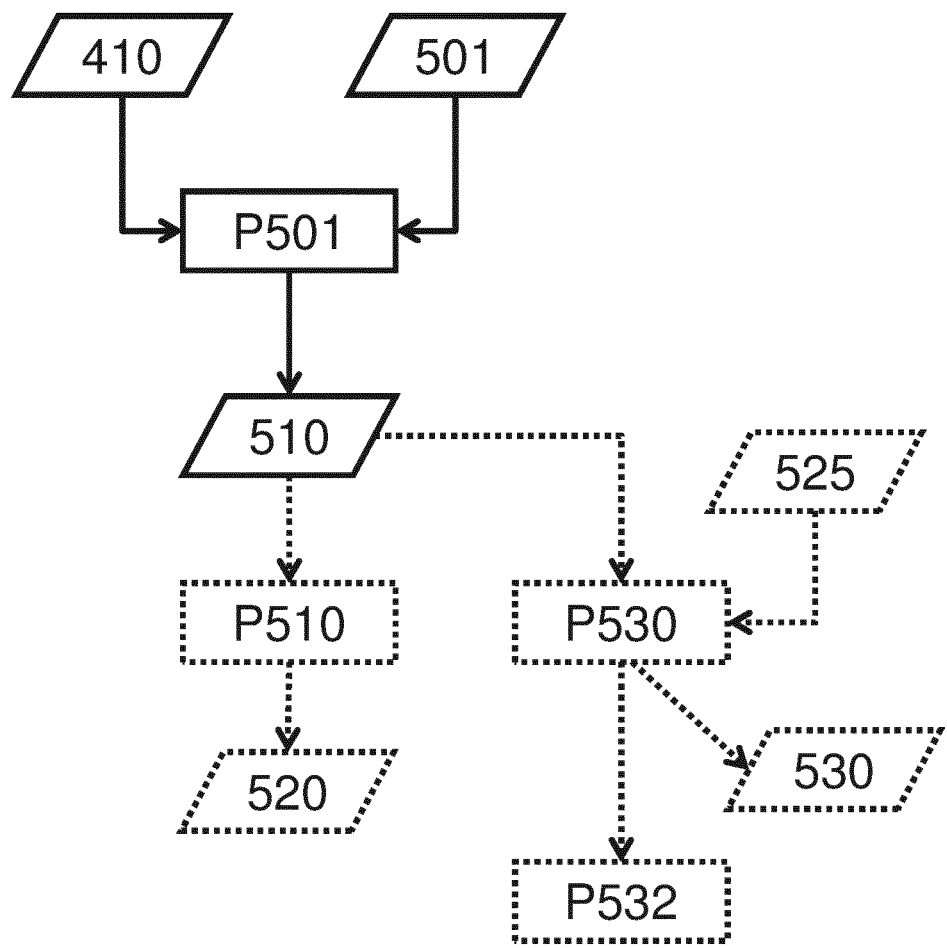
FIG. 5 is a flow chart for a method for determining an aspect (e.g., a mask pattern) of a patterning process using the trained machine learning model of FIG. 4A according to an exemplary embodiment of the present disclosure.

In an embodiment, as shown flow chart of FIG. 4B, the determining of the set of representative patterns 404 is an iterative process. An iteration involves, in procedure P414, searching for the instances 414 of a given sub-group of pattern 412 (e.g., sg1) within the hierarchy of the set of group of patterns 402 (e.g., G1-Gn). Further, procedure P416 involves categorizing the instances (e.g., as illustrated in FIG. 4C) of the given sub-group as the representative pattern 416 (e.g., R in FIG. 4C). In an embodiment, categorizing involves creating a set of representative pattern 404, where an element of the set is one pattern that represents all the instances of the searched sub-group 412.

Further, in an embodiment, information related to the representative pattern may be extracted. For example, procedure P418 involves extracting, from the design layout, pattern information 418 associated with the representative pattern (e.g., sg1). In an embodiment, the pattern information 418 comprises one or more characteristics of the representative pattern. In an embodiment, the one or more characteristics includes a geometric characteristic (e.g., size, shape, etc.), a relative position of features with respect to each other, a relative position of the representative pattern within the design layout, or other characteristics.

As mentioned earlier, existing techniques involve searching for a pattern within a design layout based on a pattern search algorithm. Such algorithm is configured to receive, as input, certain characteristics of a pattern and search for patterns within the design layout (or a portion thereof) that satisfy these characteristics. In an embodiment, the search involves comparing patterning shapes, sizes, relative positions between features with the input characteristics. However, the search results are typically no accurate and several patterns may be inaccurately classified as similar patterns leading to redundancy or omission of certain unique patterns. Furthermore, such characteristic based search on billions of patterns of the design layout or even a portion thereof is computationally intensive and not time efficient.

On the other hand, in the present disclosure, the searching for the sub-group of pattern does not directly compare the given sub-group's pattern shapes and sizes with pattern shapes and sizes within the set of group of patterns. For example, the search first searches, for example, based on an identifier (e.g., name or alpha numeric character, a string of characters, etc.) associated with a sub-group of pattern. For example, each group of the set of group of patterns is associated with a first identifier, and the one or more sub-group of patterns is associated with a second identifier.

Accordingly, the procedures of P404 can be modified to determine the set of representative patterns based on identifiers. For example, the procedure P404 involves comparing the second identifier associated with the given sub-group with identifiers within the hierarchy of each group of the set of patterns; and identifying, based on the comparison, instances of sub-groups of patterns within the set of group of patterns having the same second identifier; and categorizing the instances of the given sub-group as the representative pattern.

Although, the initial searching is not based on comparison of pattern characteristics (e.g., shapes and sizes of one or more features), the method can be further extended to perform characteristic comparison between different instances of identified patterns. The comparison is done on a relatively smaller set of patterns compared to an entire design layout, so such comparison will be computationally less intensive and fast.

Referring back to FIG. 4A, the method 400 in procedure P406 involves obtaining, via simulating an optical proximity correction process using the set of representative patterns 404, reference optical proximity correction data 406 associated with the set of representative patterns 404. In an embodiment, the obtaining of the reference optical proximity correction involves simulating the optical proximity correction process (e.g., as discussed with respect to FIG. 3) using the pattern information associated with the representative pattern, and providing the optical proximity corrections associated with the representative pattern for a patterning process.

Figure 6:
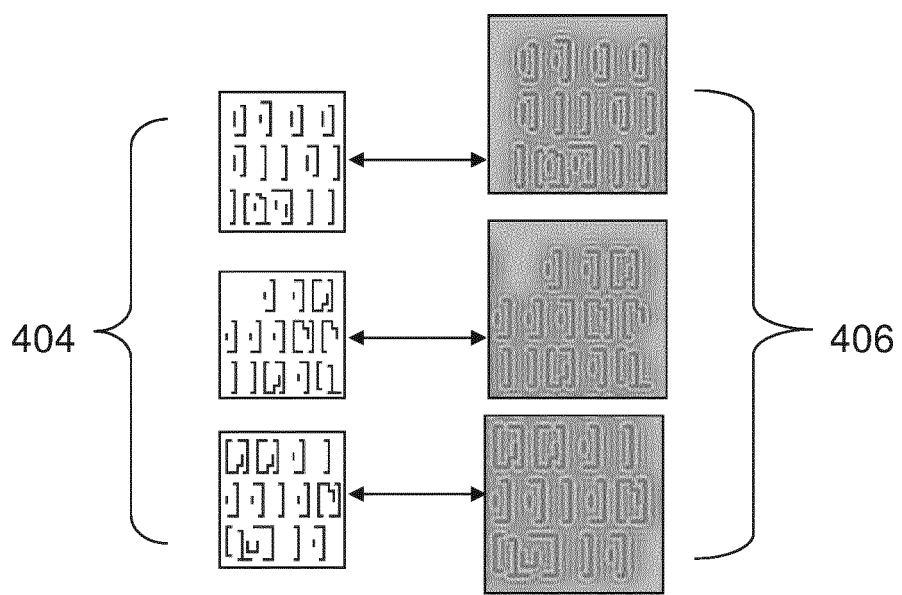
FIG. 6 illustrates example reference data in form of grayscale image (e.g., CTM) corresponding to the reference patterns according to an exemplary embodiment of the present disclosure.

FIG. 6 illustrates example reference data 406 in form of grayscale image (e.g., CTM) corresponding to the reference patterns 404. In this example, each reference pattern of 404 is associated with a reference CTM image 406. In an embodiment, both 404 and 406 may be pixelated images and pixel values of each such images may be used for training the machine learning model. Training in such a manner, the machine learning model establishes a correlation (e.g., in form of values of weights and biases of different layers of CNN) between features of a representative pattern and OPC. In an embodiment, such correlation can be further used to predict OPC for any pattern.

The present disclosure is not limited to a particular reference data e.g., OPC. A person skill in the art can modify the method 400 to generate other characteristic data related to the representative pattern and use such characteristic data for training the machine learning model to predict a characteristic associated with the design layout.

In an embodiment, the optical proximity corrections comprise placement of assist features associated with a desired pattern of the design layout. In an embodiment, the optical proximity corrections are in the form of images and the training is based on the images or pixel data of the images. As mentioned earlier (e.g., in FIG. 3), the images are continuous transmission mask (CTM) images, and/or assist feature guidance maps, wherein the CTM images and the guidance maps provide locations of assist feature associated with the set of representative patterns. In an embodiment, the assist feature guidance maps are generated by model-based OPC simulation, or rule-based OPC simulation.

In an embodiment, one or more characteristics of assist features of OPC are determined using any suitable method, based on one or more of the representative patterns 404 or one or more characteristics of the representative patterns. For example, the one or more characteristics of assist features may be determined using a method described in U.S. Pat. No. 9,111,062, or described Y. Shen, et al., *Level-Set-Based Inverse Lithography For Photomask Synthesis*, Optics Express, Vol. 17, pp. 23690-23701 (2009), the disclosures of which are hereby incorporated by reference in their entirety, and/or any other techniques described herein or in any document incorporated by reference herein. For example, the reference OPC data 406 may include the one or more characteristics such as one or more geometrical characteristics (e.g., absolute location, relative location, or shape) of the assist features, one or more statistical characteristics of the assist features (such as an average or variance of a geometric dimension of the assist features), parameterization of the assist features (e.g., one or more values of a function of the assist features, such as projection on certain basis functions) or an image or image data of the assist features (e.g., a pixelated, binary Manhattan, binary curvilinear, or continuous tone image and/or pixel values with associated locations).

Once training data (e.g., the representative patterns 404 and reference data 406) is available, procedure P408 involves training a machine learning model configured to predict optical proximity corrections 410 for the design layout 403 based on the set of representative patterns 404 and the reference optical proximity correction data 406.

In an embodiment, values of the one or more characteristics of the representative patterns 404 of the design layout and the one or more characteristics of the reference data 406 (e.g., associated with assist features) are included in training data as a sample. In an embodiment, the one or more characteristics are included in a feature vector (also called the input vector) of the sample and the one or more characteristics are included as a reference (also called the supervisory signal or answer vector) of the sample. In procedure P408, the machine learning model 410 is trained using the training data such that an objective function (e.g., a loss or cost function) may be used in the training. The objective function may be a difference between the reference data (e.g., OPC image) and a predicted data (e.g., an image) outputted by the machine learning model using the representative pattern as input.

The present disclosure has several applications. In an embodiment, the representative patterns 404 or the one or more characteristics of 404 are provided as input into the trained machine learning model and one or more characteristics of one or more assist features for the representative patterns 404 are obtained as output from the trained machine learning model 410. The one or more characteristics may include the one or more geometrical characteristics (e.g., absolute location, relative location, or shape) of the assist features. The one or more characteristics may include parameterization of the assist features, such as projection on certain basis functions. The one or more characteristics may include an image (pixelated, binary Manhattan, binary curvilinear, or continuous tone) or image data (e.g., pixel values with associated locations) of the assist features. The one or more characteristics of the assist features may be adjusted to avoid conflicts among them, for example, using a method described in U.S. Patent Application Publication No. 2008/0301620, the disclosure of which is incorporated by reference in its entirety.

Figure 9:
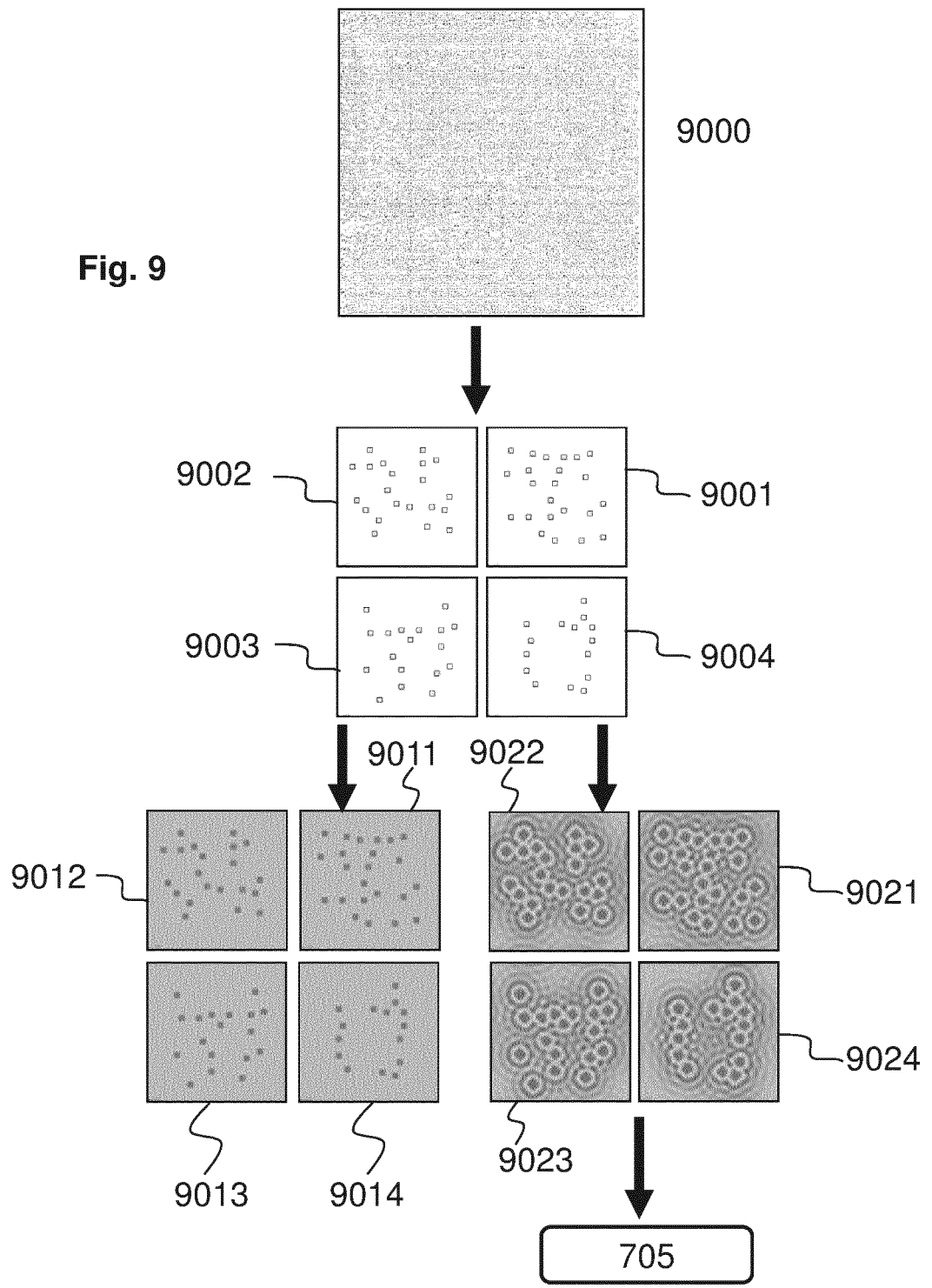
FIG. 9 is an example of training a machine learning model and the associated data according to an exemplary embodiment of the present disclosure.

FIG. 9 is an example of training a machine learning model (e.g., in process P408) and the associated data according to an exemplary embodiment of the present disclosure. In FIG. 9, one or more clips such as clips 9001, 9002, 9003, and 9004, can be representative patterns (e.g., 404) from a full chip pattern 9000. In these example, the clips correspond to contact hole arrangements. As can be seen in full chip pattern 9000, there can be billions of patterns and thus represents the significant problems of accurately, consistently and quickly performing optical proximity correction on a full chip pattern. As described above, the representative patterns are obtained systematically e.g., as discussed in process P404. On the other hand existing approaches are based on, for example, heuristics of an experienced chip designer, frequency or spectrum analysis, or a combination thereof. Such approaches have disadvantages as mentioned earlier resulting in an over-fitted or an under-fitted model.

In an embodiment, the sample clips 9001-9004 can be rendered into processed input data 9011, 9012, 9013, and 9014 such as rendered clips 9011, 9012, 9013, and 9014. In an embodiment, this rendering is not necessary. Here, the binarized clips 9001, 9002, 9003, and 9004 are transformed into gray level clips 9011, 9012, 9013, and 9014. An additional or alternative possibility for the rendering can include an initial RET applied to the clips, e.g., an application of SMO, biasing of one or more features in the clips, etc.

Further, the training process obtains optical proximity correction data 9021, 9022, 9023, and 9024 corresponding to the sample clips, such as CTM maps 9021-9024 (as illustrated in FIG. 9 wherein the light gray adjacent the dark features corresponds to assist features, such as SRAFs) corresponding to the sample clips 9001-9004, respectively. The data 9011-9014 and corresponding data 9021-9024 are then used to train the machine learning model (e.g., as discussed in process P408 in FIG. 4).

In an embodiment, the machine learning model can be specific to a particular patterning device pattern. In other words, the machine learning model may be retrained for a different patterning device pattern. In some embodiments, one trained machine learning model may be used for several different patterning device patterns having similar clip patterns.

In an embodiment, the machine learning model is specific to a particular device manufacturing process used for the patterning device pattern. For example, the device manufacturing process may be configured in terms of a certain illumination type used, certain resist used, certain projection system settings, etc. One or more of those device manufacturing process parameters may be used in generating the "truth" data and so the machine learning model may be specific to a particular configuration of the device manufacturing process. As will be appreciated, the generation of the "truth" data may involve simulations that account for perturbations to one or more of the process parameters and so the machine learning model may be extend to variances of the particular configuration of the device manufacturing process. In an embodiment, if the particular configuration of the device manufacturing process is changed in material respects, a new machine learning model may need to be trained or a prior similar machine learning model may need to be retrained.

In an embodiment, the method 400 may be implemented in cooperation with a method 500 that employs the trained machine learning model 410 to improve the patterning process. For example, improve one or more of aspects of the patterning process such as process window, OPC, yield, etc.

In an embodiment, the method 500 involves, in process P501, determining, via executing the trained machine learning model 410, mask pattern data 510 associated with a given design layout 501. Further, the process P501 may comprise outputting the mask pattern data 510 to be used in a patterning process to image a substrate. For example, the data 510 may be outputted in e.g., GDS format, text file, or other appropriate format.

In an embodiment, the mask pattern data comprises one or more characteristics of a mask to be used in a lithographic process. For example, the one or more characteristics may be geometric properties (e.g., OPC, shapes/sizes of a pattern) of the mask pattern, reflectivity of the mask, transmissivity of the mask, etc. In an embodiment, the mask pattern data comprises characteristics (e.g., OPC) upon which the patterning process adjusts one or more of process parameters including dose, focus, illumination intensity, and/or illumination pupil.

In an embodiment, the mask pattern data 510 may be used by various entities (e.g., vendors, computer systems, etc.) associated with the patterning process. In an embodiment, the mask pattern data 510 can be exported or provided in e.g., a digital form (e.g., GDS format, text file, or other appropriate format compatible with the importing entity's computer system) to a mask manufacturer. Accordingly, in an embodiment, process P510 involves fabricating, via a mask-making apparatus using the mask pattern data 510, a mask 520 to be used in a lithographic process to image a substrate. Thus, faster and more accurate mask pattern data can improve the mask manufacturing process and the mask produced therefrom as well. When such mask in in turn used in the patterning process, e.g., via a lithographic apparatus, the printed patterns will closely match the desired pattern.

In an embodiment, the mask pattern data 510 may be provided as an input to a simulation of a patterning process or models associated with the patterning process. In an embodiment, a process P530 involves determining, via simulating a process model (e.g., optics model, resist model, etch model, etc.) in cooperation with the training machine learning model 410, a process condition 530 associated with a desired pattern of the given design layout. In an embodiment, the process condition 530 comprises values of one or more of process parameters including dose, focus, illumination intensity, and/or illumination pupil.

Further, process P532 involves exposing, via a lithographic apparatus configured according to the process condition 530 employing a mask 525 corresponding to the design layout 501, a substrate. In an embodiment, the mask 525 is fabricated according to the process P510 discussed earlier. However, the mask 525 (or mask pattern data thereof) is not limited to a particular mask fabrication process. For example, the simulation step may receive any mask pattern data produced according existing process simulation methods (e.g., SMO, MO, etc.) as well.

As noted above, optical proximity correction modifies the design layout (of, for example, an advanced logic device) with the aim of, for example, providing sufficient process window (PW) for forming the design layout on a substrate. For example, an assist feature (as an example of OPC), particularly a SRAF, can modify the environment of isolated main features of the design layout in a manner such that the isolated features appear dense, which can enable scaling down of such main features by providing sufficient process window (PW). So, an optical proximity correction that is sufficient, accurate and consistent throughout a full-chip is desired. But, the run-time of the optical proximity correction should be fast to enable application of optical proximity correction to a full-chip in a timely manner.

Among optical proximity correction techniques, a model-based optical proximity correction approach can deliver a large process window (PW) with good accuracy and consistency, but often at the expensive of speed. For example, SMO-MO is an optical proximity correction technique that can deliver a large process window (PW). In an embodiment, SMO-MO can use a SMO process to identify an optimum illumination and patterning device pattern (which optimization may be constrained in terms of the type of OPC corrections used, e.g., no application of assist features) and then that optimum illumination is used to further optimize the patterning device pattern in terms of optical proximity correction (e.g., application of assist features). In an embodiment, SMO-MO uses a gradient-based iterative approach to optimize a continuous tone patterning device pattern so that the associated cost function is minimized/maximized In each iteration, the gradient map of the patterning device pattern is calculated and the gradient map is further used to guide the direction of the optimization (e.g., the application of OPC such as placement of assist features). SMO-MO can be highly accurate and may yield the largest process window; however the run-time can be prohibitive for full-chip applications.

Another model-based approach for optical proximity correction is use of a so-called SRAF Guidance Map (SGM) (see, e.g., U.S. Patent Application Publication No. US 2008-0301620 previously incorporated herein by reference), which is relatively faster than other approaches but can fall short on delivering an optimal process window.

Other full-chip optical proximity corrections are relatively faster than SMO-MO but each can have some disadvantages. For example, rule-based optical proximity correction approaches involve application of two-dimensional (2D) rules to apply optical proximity corrections (such as placement of assist features). But, the determination and comprehensiveness of the rules can be difficult to implement and may not guarantee accuracy of 2D rules for logic applications.

In the context of assist features, their placement typically should have accuracy less than the size of the pixels of the patterning device pattern used in the optical proximity correction process to enable the process to complete in a timely manner. For example, the accuracy should be selected from the range 0 to about 10 nm. Alternatively or additionally, consistency and/or symmetry in placement of assist features is highly desired. Consistency refers to repeating patterns in a patterning device pattern (e.g., a full chip patterning device pattern) having substantially similar assist feature placements. Assist feature placement should desirably have symmetry complying with the pattern symmetry and the illumination distribution shape symmetry (e.g., symmetry with a dipole or quadrupole illumination). But, existing techniques may not provide such accuracy, consistency and/or symmetry at a full chip level.

So, in an embodiment and as already described to some extent above with respect to FIGS. 3 and 4, a machine learning process can be advantageous to enabling accurate and complete application of optical proximity correction (such as placement of assist features) and can do so in a quick manner for, e.g., full chip applications.

While existing deep learning structures are available for image recognition, the machine learning techniques herein differ from such image recognition in many aspects including, but not limited to, the inputs provided to the machine learning model for training and for use of the trained machine learning model, the output from the machine learning model, a resolution desired, and/or an objective function used in training the machine learning model.

For example, to propagate the process window benefits of some of the techniques described above (such as SMO-MO)

from clip level (which refers to a portion of the full chip patterning pattern) to the full chip patterning device pattern, a machine learning based optical proximity correction technique is described herein that takes, as training data, data from such other techniques at, for example, a clip level to enable the prediction of optical proximity correction by a machine learning model based on data regarding a patterning device pattern such as a full chip pattern. According to an embodiment, a machine learning model is trained using training data generated by SMO-MO and subsequently the trained model is applied to a full chip layout for optical proximity correction application.

Further, in an embodiment, deep learning can be applied to optical proximity correction prediction (e.g., SRAF placement problem). Compared with traditional machine learning techniques, deep learning can, e.g.: 1) require no manual feature engineering, 2) is capable of learning a large amount of data, and/or 3) can have high accuracy.

In an embodiment, the techniques herein can be seamlessly integrated into a full-chip OPC flow, such as an ASML Tachyon OPC flow. For example, a predicted optical proximity correction map (e.g., an assist feature map) can be used to apply the optical proximity corrections on a design pattern (e.g., SRAF extraction) and be subject to further OPC. Additionally, user-defined mask constraints can be applied to application of the optical proximity corrections and/or print check can be made at process conditions (e.g., using ASML's LMC tool).

In an embodiment, the machine learning techniques herein can be extended to other applications in OPC where image prediction is desired, e.g., the initialization of an advanced inverse computational lithography engine.

For optical proximity correction prediction, it is desirable to use a target design pattern (which can be a clip or a full chip) to predict an (optimized) optical proximity correction prediction for that target design pattern. But there are many different options for machine learning input and output. In an embodiment, a target design pattern and an optical proximity corrected design pattern can be typically, for, e.g., manufacturing purposes, in a GDS (GDSII), OASIS or other similar format, which means they are binary. For a machine learning process, an image can be used to predict an image of the optical proximity correction. So, in an embodiment, the binary target design pattern in GDS (GDSII), OASIS or other similar format is converted to a pixelated image. In a first possibility, the target design pattern is converted into a binary pixelated image. In another possibility, the target design pattern is converted into a gray-scale pixelated image. As noted above, it can be desirable to choose the latter option—a gray-scale pixelated image. The reasons for this include, e.g.: 1) For a same given pixel size (image resolution), a gray-scale image has a significant amount more information than a binary image because of the additional degree of freedom of "continuous" intensity depending on the number of gray levels. In other words, to keep the same amount of information as a binary pixelated image, a gray-scale image can have a larger pixel size than a binary pixelated image and thus can speed up the computation; and/or 2) an advanced mask optimization engine (e.g., an SMO or iOPC software tool such ASML's Tachyon software) can directly provide a CTM image for a given target design pattern, which CTM image is in gray scale.

So, in an embodiment, for the machine learning input image, a mask model can be used to render a binary target design pattern into a gray-scale target design pattern image. For the machine learning output image (including the benchmark data for the machine learning), a CTM image can be used, which can be generated using a CTM generation software program for machine learning model training.

But, there can be some other possibilities for the machine learning model input image. For example, a gray-scale target design pattern image can be convolved with one or more optical kernels, for example, one or more TCC kernels, to generate one or more additional signal images. In an embodiment, a single gray-scale target design pattern image can be yield more than one signal image because there can be numerous optical kernels (e.g., TCC kernels) in a model. In an embodiment, all the signal images can be used in a machine learning model training or a selection of one or more signal images can be used. As a further example, an output image of a model-based SGM software engine can be used as a machine learning input image. In most cases, such an image is closer to a CTM image than a gray-scale target design pattern image created by a mask model.

With the machine learning input image, the machine learning model then only needs to learn the difference (or error) between them, which can make the task easier. So, to summarize, for machine learning input, there can be several possibilities including 1) a gray-scale target design pattern image, 2) one or more signal images, and/or 3) a SGM. Since machine learning can take in a couple of images with the same size as one input, one or a mix of them can be chosen as the input for the machine learning.

Several neural network structures have been designed for deep learning tasks. As an example, for image recognition tasks, architectures include, for example, AlexNet (see, e.g., A. Krizhevsky et al., "ImageNet Classification with Deep Convolutional Neural Networks", Advances in Neural Information Processing Systems 25 (NIPS 2012), which is incorporated herein in its entirety by reference), GoogLeNet (see, e.g., C. Szegedy et al., "Going Deeper with Convolutions," 2015 IEEE Conference on Computer Vision and Pattern Recognition (CVPR), which is incorporated herein in its entirety by reference), VGG (see, e.g., K. Simonyan et al., "Very Deep Convolutional Networks for Large-Scale Image Recognition", International Conference on Learning Representations (2015), which is incorporated herein in its entirety by reference), and ResNet (see, e.g., K. He et al., "Deep Residual Learning for Image Recognition", 2016 IEEE Conference on Computer Vision and Pattern Recognition (CVPR), which is incorporated herein in its entirety by reference). Each of those designs has its own intuition and strength. However these are not necessarily directly applicable to predicting optical proximity corrections for a design pattern as described herein because optical proximity correction prediction differs significantly from traditional deep learning tasks. For example, a typical image classification problem has fixed input and output size while for optical proximity correction prediction it is desirable to address images with different sizes. As a further example, pooling layers (with stride larger than 1) are often used to provide dimensionality reduction and improve local invariance. However, this tends not be useful for optical proximity correction prediction since the input and output image pair usually has the same size. So, in an embodiment, there is described hereafter a new neural network as a machine learning model for optical proximity correction prediction.

In an embodiment of this neural network, there is provided one or more fundamental building blocks and then a deep network is constructed by stacking instances of one or more the fundamental blocks. For the one or more fundamental blocks, there are several options. A first type of fundamental block is a convolutional layer as known in the art. Another type of fundamental block is an inception block.

Figure 10:
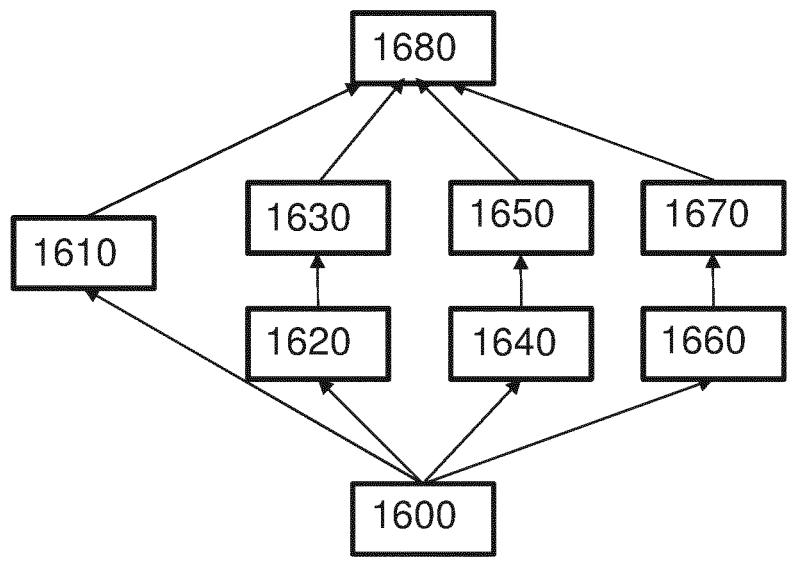
FIG. 10 illustrates an example inception block for a neural network according to an exemplary embodiment of the present disclosure.
Figure 11:
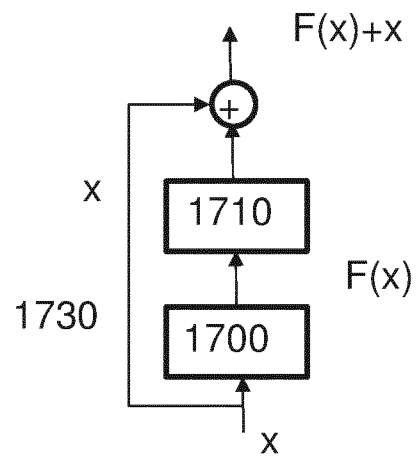
FIG. 11 illustrates an example residual block for a neural network according to an exemplary embodiment of the present disclosure.

The inception block consists of maximum one pooling layer with a stride of 1 and two or more convolutional layers with different filter sizes. An example inception block is presented in FIG. 10. In FIG. 10, blocks 1610-1650 and 1670 represent convolution layers (e.g., 1×1 convolutions 1610, 1620, 1640, 1670, 3×3 convolutions 1630 and 5×5 convolutions 1650 although different arrangements can be provided). Further, block 1660 represents the one pooling layer (e.g., 3×3 max pooling), block 1680 represents the filters (e.g., a filter concatenation) and block 1600 generally refers to a previous layer (such as another inception block). A further type of fundamental block is a residual block. The residual block has two convolutional layers and an additional path to directly connect the input and output of the residual block. An example of a residual block is presented in FIG. 11. Blocks 1700 and 1710 represent the convolution layers, which in this case can generally a function F of input x. Line 1720 represents the additional path to directly connect the input and output of the residual block. In this example, the path connects the input to an adder to combine the value x with F(x) to yield F(x)=x. So, to create a deep neural network, one or more instances of one or more of these fundamental blocks are connected. In an embodiment, one type of fundamental block can be used for the whole neural network. In an embodiment, a mix different fundamental blocks can be used in neural network.

An advantage of these fundamental blocks is that they can support flexible input image sizes because essentially only convolution and pooling operations are used. The final deep neural network thus also supports a flexible output image size.

In an embodiment, a lithographic apparatus may be configured to be controlled in cooperation with the representative patterns (e.g., 404) and/or the trained machine learning model 410. For example, a processor of the lithographic apparatus (e.g., FIGS. 1, 2, 14 and 15).

In an embodiment, there is provided a lithographic apparatus for a patterning process includes a mask associated with a design layout, a substrate to be imaged using the mask, and a processor (e.g., the processor 104 in FIG. 13) configured to control the lithographic apparatus. In an embodiment, the processor is configured to obtain (i) a set of representative patterns (e.g., 404) of the design layout (e.g., 403 or 501) to be printed on the substrate, and (ii) process conditions (e.g., 530) associated with the set of representative patterns. Further, the processor is configured to control, via the lithographic apparatus, parameters of the patterning process according to the process conditions.

As mentioned earlier, in an embodiment, the design layout (e.g., 403) comprises a set of group of patterns (e.g., 402) arranged in a hierarchical manner Furthermore, as discussed in the method 400, the representative pattern is obtained by identifying one or more sub-group of patterns (e.g., 403) whose instances appear in the hierarchy of the set of group patterns of the design layout.

In an embodiment, as mentioned earlier, the process conditions are obtained via simulating a patterning process using the set of representative patterns such that a performance metric of the lithographic apparatus is improved. In an embodiment, the process conditions comprises values of one or more process parameters including dose, focus, illumination intensity, and/or illumination pupil. In an embodiment, the performance metric is at least one of: an edge placement error of a representative pattern, a critical dimension of the representative pattern, or yield.

Figure 12:
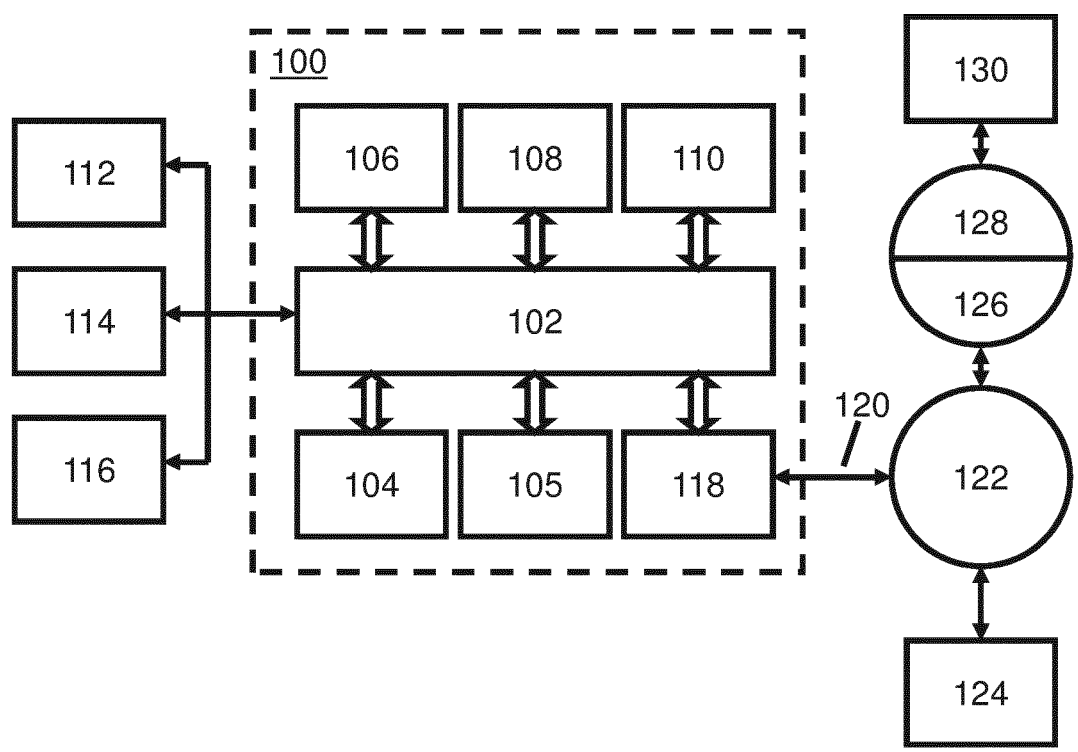
FIG. 12 is a block diagram of an example computer system according to an exemplary embodiment of the present disclosure.

FIG. 12 is a block diagram that illustrates a computer system 100 which can assist in implementing methods and flows disclosed herein. Computer system 100 includes a bus 102 or other communication mechanism to communicate information, and a processor 104 (or multiple processors 104 and 105) coupled with bus 102 to process information. Computer system 100 may also include a main memory 106, such as a random access memory (RAM) or other dynamic storage device, coupled to bus 102 to store or supply information and instructions to be executed by processor 104. Main memory 106 may be used to store or supply temporary variables or other intermediate information during execution of instructions to be executed by processor 104. Computer system 100 may further include a read only memory (ROM) 108 or other static storage device coupled to bus 102 to store or supply static information and instructions for processor 104. A storage device 110, such as a magnetic disk or optical disk, may be provided and coupled to bus 102 to store or supply information and instructions.

Computer system 100 may be coupled via bus 102 to a display 112, such as a cathode ray tube (CRT) or flat panel or touch panel display, to display information to a computer user. An input device 114, including alphanumeric and other keys, may be coupled to bus 102 to communicate information and command selections to processor 104. Another type of user input device may be cursor control 116, such as a mouse, a trackball, or cursor direction keys, to communicate direction information and command selections to processor 104 and to control cursor movement on display 112. This input device typically has two degrees of freedom in two axes, a first axis (e.g., x) and a second axis (e.g., y), that allows the device to specify positions in a plane. A touch panel (screen) display may also be used as an input device.

According to an embodiment, portions of a process described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a disk or memory of a remote computer. The remote computer can load the instructions into its dynamic memory and send the instructions over a communications path. Computer system 100 can receive the data from the path and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may include a communication interface 118 coupled to bus 102. Communication interface 118 provides a two-way data communication coupling to a network link 120 that is connected to a network 122. For example, communication interface 118 may provide a wired or wireless data communication connection. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through network 122 to a host computer 124 or to data equipment operated by an Internet Service Provider (ISP) 126. ISP 126 in turn provides data communication services through the worldwide packet data communication network, now commonly referred to as the "Internet" 128. Network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, network 122 and communication interface 118. One such downloaded application may provide for the code to implement a method herein, for example. The received code may be executed by processor 104 as it is received, or stored in storage device 110, or other non-volatile storage for later execution. In this manner, computer system 100 may obtain application code in the form of a carrier wave.

Figure 13:
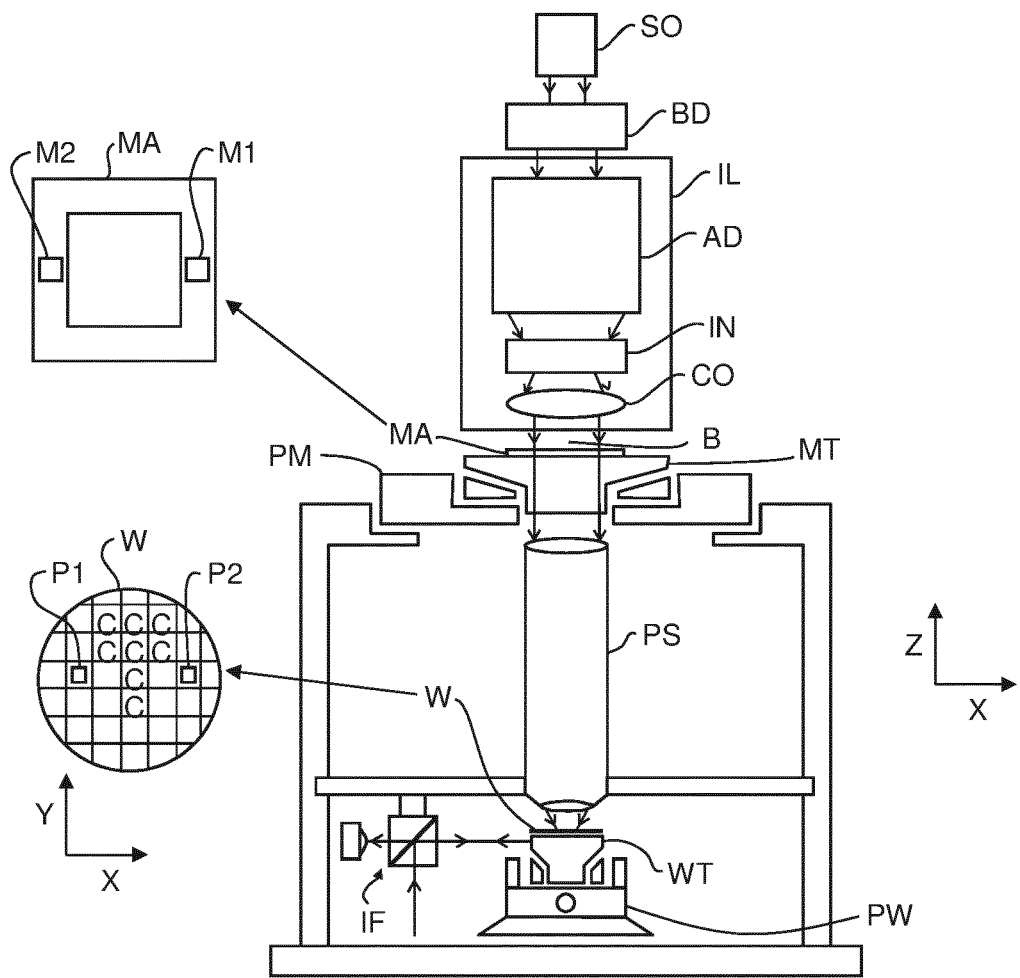
FIG. 13 is a schematic diagram of a lithographic projection apparatus according to an exemplary embodiment of the present disclosure.

FIG. 13 schematically depicts an exemplary lithographic projection apparatus. The apparatus comprises:
- an illumination system IL, to condition a beam B of radiation. In this particular case, the illumination system also comprises a radiation source SO;
- a first object table (e.g., mask table) MT provided with a patterning device holder to hold a patterning device MA (e.g., a reticle), and connected to a first positioner PM to accurately position the patterning device with respect to item PS;
- a second object table (substrate table) WT provided with a substrate holder to hold a substrate W (e.g., a resist-coated silicon wafer), and connected to a second positioner PW to accurately position the substrate with respect to item PS;
- a projection system PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning device as an alternative to the use of a classic mask; examples include a programmable mirror array or LCD matrix.

The source SO (e.g., a mercury lamp or excimer laser) produces a beam of radiation. This beam is fed into an illumination system (illuminator) IL, either directly or after having traversed a conditioner, such as a beam expander. The illuminator IL may comprise an adjuster AD configured to set the outer or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 13 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors BD); this latter scenario is often the case when the source SO is an excimer laser (e.g., based on KrF, ArF or $F_2$ lasing).

The beam B subsequently intercepts the patterning device MA, which is held on a patterning device table MT. Having traversed the patterning device MA, the beam B passes through the projection system PS, which focuses the beam B onto a target portion C of the substrate W. With the aid of the second positioner PW (and interferometer IF), the substrate table WT can be moved accurately, e.g. so as to position different target portions C in the path of the beam B. Similarly, the first positioner PM can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 13.

Patterning device (e.g., mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies Small alignment markers may also be included within dies, in amongst the device features, in which case it is desirable that the markers be as small as possible and not require any different imaging or process conditions than adjacent features.

Figure 14:
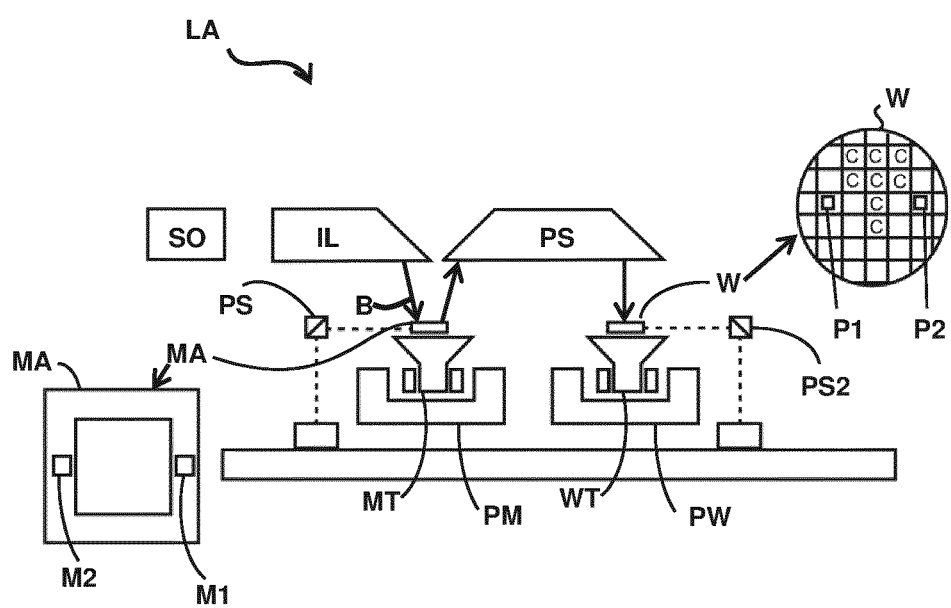
FIG. 14 is a schematic diagram of another lithographic projection apparatus according to an exemplary embodiment of the present disclosure.

FIG. 14 schematically depicts another exemplary lithographic projection apparatus LA. The lithographic projection apparatus LA includes:
- a source collector module SO;
- an illumination system (illuminator) IL configured to condition a radiation beam B (e.g. EUV radiation);
- a support structure (e.g. a mask table) MT constructed to support a patterning device (e.g. a mask or a reticle) MA and connected to a first positioner PM configured to accurately position the patterning device;
- a substrate table (e.g. a wafer table) WT constructed to hold a substrate (e.g. a resist coated wafer) W and connected to a second positioner PW configured to accurately position the substrate; and
- a projection system (e.g. a reflective projection system) PS configured to project a pattern imparted to the radiation beam B by patterning device MA onto a target portion C (e.g. comprising one or more dies) of the substrate W.

As here depicted, the apparatus LA is of a reflective type (e.g. employing a reflective mask). It is to be noted that because most materials are absorptive within the EUV wavelength range, the patterning device may have a multi-layer reflector comprising, for example, a multi-stack of molybdenum and silicon. In one example, the multi-stack reflector has a 40 layer pairs of molybdenum and silicon. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 14, the illuminator IL receives an extreme ultra violet (EUV) radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 14, to provide the laser beam to excite the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors or a beam expander. In other cases the source may be an integral part of the source collector module, for example when the source is a discharge produced plasma EUV generator, often termed as a DPP source.

The illuminator IL may comprise an adjuster configured to adjust the angular intensity distribution of the radiation beam. Generally, at least the outer or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X or Y direction so that a different target portion C can be exposed.

2. In scan mode, the support structure (e.g. mask table) MT and the substrate table WT are scanned synchronously in a given direction (the so-called "scan direction") while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Further, the lithographic apparatus may be of a type having two or more tables (e.g., two or more substrate table, two or more patterning device tables, or a substrate table and a table without a substrate). In such "multiple stage" devices the additional tables may be used in parallel, or preparatory steps may be carried out on one or more tables while one or more other tables are being used for exposures.

Figure 15:
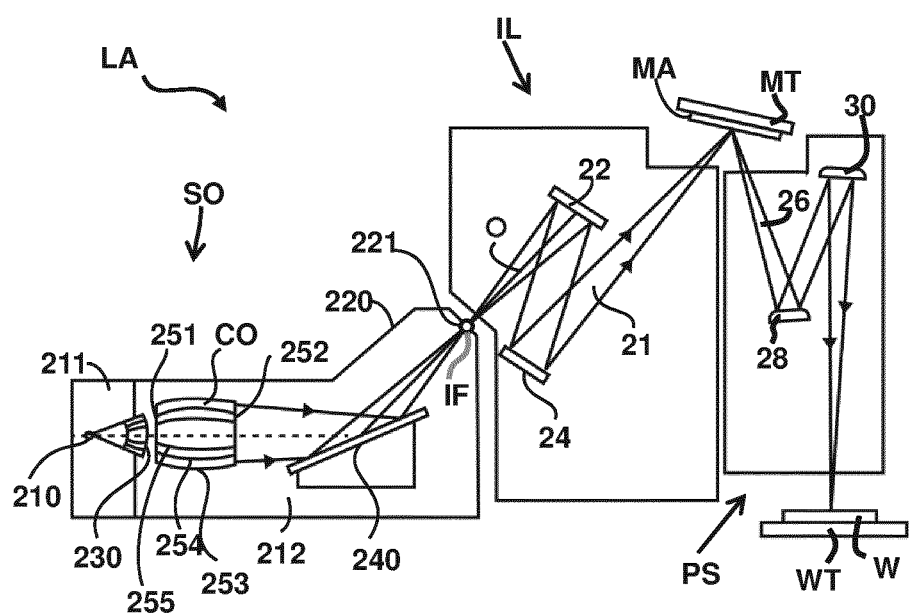
FIG. 15 is a more detailed view of the apparatus in FIG. 13 according to an exemplary embodiment of the present disclosure.

FIG. 15 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 15.

Collector optic CO, as illustrated in FIG. 15, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type is desirably used in combination with a discharge produced plasma source, often called a DPP source.

Figure 16:
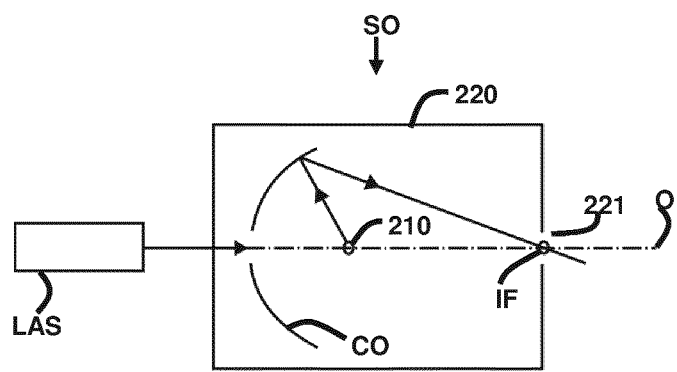
FIG. 16 is a more detailed view of the source collector module SO of the apparatus of FIGS. 14 and 15, according to an embodiment.

Alternatively, the source collector module SO may be part of an LPP radiation system as shown in FIG. 16. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses:

1. A method of determining representative patterns for training a machine learning model to predict optical proximity corrections, the method comprising:
   obtaining a design layout comprising a set of group of patterns, each group of patterns includes one or more sub-groups;
   determining a set of representative patterns of the set of group of patterns, a representative pattern being a sub-group whose instances appear in the set of group patterns;
   obtaining, via simulating an optical proximity correction process using the set of representative patterns, reference optical proximity correction data associated with the set of representative patterns; and
   training a machine learning model to predict optical proximity corrections for the design layout based on the set of representative patterns and the set of reference optical proximity correction data.

2. The method of clause 1, wherein the group of patterns are arranged in a hierarchy in which each group of patterns includes the one or more sub-groups of pattern.

3. The method of clause 2, wherein the determining the set of representative patterns is an iterative process, an iteration comprises:
   searching for the instances of a given sub-group of pattern within the hierarchy of the set of group of patterns;
   categorizing the instances of the given sub-group as the representative pattern; and
   extracting, from the design layout, pattern information associated with the representative pattern.

4. The method of any of clauses 1-3, wherein each group of the set of group of patterns is associated with a first identifier, and the one or more sub-group of patterns is associated with a second identifier.

5. The method of clause 4, wherein the determining the set of representative patterns comprises:
   comparing the second identifier associated with the given sub-group with identifiers within the hierarchy of each group of the set of patterns; and
   identifying, based on the comparison, instances of sub-groups of patterns within the set of group of patterns having the same second identifier; and
   categorizing the instances of the given sub-group as the representative pattern.

6. The method of any of clauses 1-5, wherein the obtaining of the reference optical proximity correction comprises:
   simulating the optical proximity correction process using the pattern information associated with the representative pattern; and
   providing the optical proximity corrections associated with the representative pattern for a patterning process.

7. The method of any of clauses 1-6, wherein the searching for the sub-group of pattern does not directly compare the given sub-group's pattern shapes and sizes with pattern shapes and sizes within the set of group of patterns.

8. The method of any of clauses 1-7, wherein the optical proximity corrections comprise placement of assist features associated with a desired pattern of the design layout.

9. The method of any of clauses 1-8, wherein the optical proximity corrections are in the form of images and the training is based on the images or pixel data of the images.

10. The method of clause 9, wherein the images are continuous transmission mask (CTM) images, and/or assist feature guidance maps, wherein the CTM images and the guidance maps provide locations of assist feature associated with the set of representative patterns.

11. The method of clause 10, wherein the assist feature guidance maps are generated by model-based OPC simulation, or rule-based OPC simulation.

12. The method of any of clauses 1-11, further comprising:
    determining, via the trained machine learning model, mask pattern data associated with a given design layout;
    outputting the mask pattern data to be used in a patterning process to image a substrate.

13. The method of clause 12, further comprising:
    fabricating, via a mask-making apparatus using the mask pattern data, a mask to be used in the patterning process to image the substrate.

14. The method of any of clauses 12-13, wherein the mask pattern data comprises characteristics upon which the patterning process adjusts one or more of process parameters including dose, focus, illumination intensity, and/or illumination pupil.

15. The method of any of clauses 1-14, further comprising:
    determining, via simulating a process model in cooperation with the training machine learning model, a process condition associated with a desired pattern of the given design layout; and
    exposing, via a lithographic apparatus configured according to the process condition employing a mask corresponding to the design layout, a substrate.

16. The method of clause 15, wherein the process condition comprises values of one or more of process parameters including dose, focus, illumination intensity, and/or illumination pupil.

17. A lithographic apparatus for a patterning process comprising:
    a mask associated with a design layout;
    a substrate to be imaged using the mask; and
    a processor configured to:
        obtain (i) a set of representative patterns of the design layout to be printed on the substrate, and (ii) process conditions associated with the set of representative patterns; and
        control, via the lithographic apparatus, parameters of the patterning process according to the process conditions.

18. The lithographic apparatus of clause 17, wherein the design layout comprises a set of group of patterns arranged in a hierarchical manner 19. The lithographic apparatus of clause 18, wherein the representative pattern is obtained by identifying one or more sub-group of patterns whose instances appear in the hierarchy of the set of group patterns of the design layout.

20. The lithographic apparatus of any of clauses 17-19, the process conditions are obtained via simulating a patterning process using the set of representative patterns such that a performance metric of the lithographic apparatus is improved.

21. The lithographic apparatus of clause 20, wherein the process conditions comprises values of one or more process parameters including dose, focus, illumination intensity, and/or illumination pupil.

22. The lithographic apparatus of clause 20, wherein the performance metric is at least one of: an edge placement error of a representative pattern, a critical dimension of the representative pattern, or yield.

23. A computer program product comprising a non-transitory computer readable medium having instructions recorded thereon, the instructions when executed by a computer implementing the method of any of the above clauses.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

The concepts disclosed herein may be applicable to any device manufacturing process involving a lithographic apparatus, and may be especially useful with emerging imaging technologies capable of producing wavelengths of an increasingly smaller size. Emerging technologies already in use include deep ultraviolet (DUV) lithography that is capable of producing a 193 nm wavelength with the use of an ArF laser, and even a 157 nm wavelength with the use of a fluorine laser. Moreover, EUV lithography is capable of producing wavelengths within a range of 5-20 nm.

While the concepts disclosed herein may be used for device manufacturing on a substrate such as a silicon wafer, it shall be understood that the disclosed concepts may be used with any type of lithographic imaging systems, e.g., those used for imaging on substrates other than silicon wafers.

The patterning device referred to above comprises or can form a design layout. The design layout can be generated utilizing a CAD (computer-aided design) program. This process is often referred to as EDA (electronic design automation). Most CAD programs follow a set of predetermined design rules in order to create functional design layouts/patterning devices. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the substrate (via the patterning device).

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:
    a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means.
    a programmable LCD array.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

So, as noted, microlithography is a significant step in the manufacturing of devices such as ICs, where patterns formed on substrates define functional elements of the ICs, such as microprocessors, memory chips etc. Similar lithographic techniques are also used in the formation of flat panel displays, micro-electro mechanical systems (MEMS) and other devices.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term "optimizing" and "optimization" as used herein refers to or means adjusting a patterning process apparatus, one or more steps of a patterning process, etc. such that results and/or processes of patterning have more desirable characteristics, such as higher accuracy of transfer of a design layout on a substrate, a larger process window, etc. Thus, the term "optimizing" and "optimization" as used herein refers to or means a process that identifies one or more values for one or more parameters that provide an improvement, e.g. a local optimum, in at least one relevant metric, compared to an initial set of one or more values for those one or more parameters. "Optimum" and other related terms should be construed accordingly. In an embodiment, optimization steps can be applied iteratively to provide further improvements in one or more metrics.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, these inventions have been grouped into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary sections of the present document should be taken as containing a comprehensive listing of all such inventions or all aspects of such inventions.

It should be understood that the description and the drawings are not intended to limit the present disclosure to the particular form disclosed, but to the contrary, the intention is to cover all modifications, equivalents, and alternatives falling within the spirit and scope of the inventions as defined by the appended claims.

Modifications and alternative embodiments of various aspects of the inventions will be apparent to those skilled in the art in view of this description. Accordingly, this description and the drawings are to be construed as illustrative only and are for the purpose of teaching those skilled in the art the general manner of carrying out the inventions. It is to be understood that the forms of the inventions shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

In the above description, any processes, descriptions or blocks in flowcharts should be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art.

While certain embodiments have been described, these embodiments have been presented by way of example only, and are not intended to limit the scope of the present disclosures. Indeed, the novel methods, apparatuses and systems described herein can be embodied in a variety of other forms; furthermore, various omissions, substitutions and changes in the form of the methods, apparatuses and systems described herein can be made without departing from the spirit of the present disclosures. The accompanying claims and their equivalents are intended to cover such forms or modifications as would fall within the scope and spirit of the present disclosures. For example, this technology may be structured for cloud computing whereby a single function is shared and processed in collaboration among a plurality of apparatuses via a network.

What is claimed is:

1. A method of determining representative patterns for training a machine learning model to predict optical proximity corrections, the method comprising:
   obtaining a design layout comprising a set of groups of patterns, each group of patterns includes one or more sub-groups, each sub-group of the one or sub-groups of that group comprising one or more patterns of that group;
   determining a set of representative patterns of the set of groups of patterns, a representative pattern being a sub-group whose instances appear in the set of groups of patterns;
   obtaining, via simulating an optical proximity correction process using the set of representative patterns, optical proximity correction data associated with the set of representative patterns; and
   training a machine learning model to predict optical proximity corrections for the design layout, based on the set of representative patterns and the optical proximity correction data.

2. The method of claim 1, wherein the groups of patterns are arranged in a hierarchy in which each group of patterns includes the one or more sub-groups.

3. The method of claim 2, wherein the determining the set of representative patterns is an iterative process, an iteration comprising:
   searching for the instances of a given sub-group within the hierarchy of the set of groups of patterns;
   categorizing the instances of the given sub-group as the representative pattern; and
   extracting, from the design layout, pattern information associated with the representative pattern.

4. The method of claim 1, wherein each group of the set of groups of patterns is associated with a first identifier, and the one or more sub-groups is associated with a second identifier.

5. The method of claim 4, wherein the determining the set of representative patterns comprises:
   comparing the second identifier associated with a given sub-group with identifiers within a hierarchy of the set of groups of patterns; and
   identifying, based on the comparison, instances of the given sub-group within the set of groups of patterns having the same second identifier; and
   categorizing the instances of the given sub-group as a representative pattern of the set of representative patterns.

6. The method of claim 1, wherein the obtaining of the optical proximity correction data comprises:
   simulating the optical proximity correction process using pattern information associated with a representative pattern of the set of representative patterns; and
   providing the optical proximity correction data associated with the representative pattern for a patterning process.

7. The method of claim 1, wherein the determining the set of representative patterns comprising searching for a given sub-group of the one or more sub-groups within the set of groups of patterns and the searching for the given sub-group does not directly compare the given sub-group's one or more patterns' shapes and sizes with pattern shapes and sizes within the set of groups of patterns.

8. The method of claim 1, wherein the optical proximity corrections comprise placement of one or more assist features associated with a desired pattern.

9. The method of claim 1, wherein the optical proximity correction data is in the form of images and the training is based on the images or pixel data of the images.

10. The method of claim 9, wherein the images are continuous transmission mask (CTM) images, and/or assist feature guidance maps, wherein the CTM images and/or assist feature guidance maps provide assist feature locations associated with the set of representative patterns, and/or wherein the images are assist feature guidance maps generated by model-based optical proximity correction (OPC) simulation, or rule-based OPC simulation.

11. The method of claim 1, further comprising:
    determining, via the trained machine learning model, mask pattern data; and
    outputting the mask pattern data to be used in a patterning process to image a substrate.

12. The method of claim 11, further comprising fabricating, via a mask-making apparatus using the mask pattern data, a mask to be used in the patterning process to image the substrate, and/or
  wherein the mask pattern data comprises characteristics upon which the patterning process adjusts one or more process parameters including dose, focus, illumination intensity, and/or an illumination pupil.

13. The method of claim 1, further comprising:
  determining, via simulating using a process model in cooperation with the trained machine learning model, a process condition associated with a desired pattern; and
  exposing, via a lithographic apparatus configured according to the process condition and employing a mask corresponding to the desired pattern, a substrate.

14. The method of claim 13, wherein the process condition comprises a value of one or more process parameters including dose, focus, illumination intensity, and/or an illumination pupil.

15. A computer program product comprising a non-transitory computer readable medium having instructions therein, the instructions, when executed by a computer system, configured to cause the computer system to at least:
  obtain a design layout comprising a set of groups of patterns, each group of patterns includes one or more sub-groups, each sub-group of the one or sub-groups of that group comprising one or more patterns of that group;
  determine a set of representative patterns of the set of groups of patterns, a representative pattern being a sub-group whose instances appear in the set of groups of patterns;
  obtain, via simulating an optical proximity correction process using the set of representative patterns, reference optical proximity correction data associated with the set of representative patterns; and
  train a machine learning model to predict optical proximity corrections for the design layout, based on the set of representative patterns and the set of reference optical proximity correction data.

16. The computer program product of claim 15, wherein the groups of patterns are arranged in a hierarchy in which each group of patterns includes the one or more sub-groups.

17. The computer program product of claim 16, wherein the instructions configured to cause the computer system to determine the set of representative patterns are further configured to cause the computer system to do as an iterative process, an iteration comprising:
  search for the instances of a given sub-group within the hierarchy of the set of groups of patterns;
  categorization of the instances of the given sub-group as the representative pattern; and
  extraction, from the design layout, of pattern information associated with the representative pattern.

18. The computer program product of claim 15, wherein the instructions configured to cause the computer system to determine the set of representative patterns are further configured to cause the computer system to:
  compare an identifier associated with a given sub-group with identifiers within a hierarchy of the set of groups of patterns; and
  identify, based on the comparison, instances of the given sub-group within the set of groups of patterns having the same identifier; and
  categorize the instances of the given sub-group as a representative pattern of the set of representative patterns.

19. The computer program product of claim 15, wherein the instructions configured to cause the computer system to determine the set of representative patterns are further configured to cause the computer system to search for a given sub-group of the one or more sub-groups within the set of groups of patterns, wherein the search for the given sub-group does not directly compare the given sub-group's one or more patterns' shapes and sizes with pattern shapes and sizes within the set of groups of patterns.

20. The computer program product of claim 15, wherein the instructions are further configured to cause the computer system to:
  determine, via the trained machine learning model, mask pattern data; and
  output the mask pattern data to be used in a patterning process to image a substrate.

* * * * *